United States Patent
Kameda et al.

(10) Patent No.: US 8,536,890 B2
(45) Date of Patent: Sep. 17, 2013

(54) SEMICONDUCTOR INSPECTING DEVICE AND SEMICONDUCTOR INSPECTING METHOD

(75) Inventors: Yoshio Kameda, Tokyo (JP); Masamoto Tago, Tokyo (JP); Yoshihiro Nakagawa, Tokyo (JP); Koichiro Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 393 days.

(21) Appl. No.: 12/865,201

(22) PCT Filed: Feb. 5, 2009

(86) PCT No.: PCT/JP2009/051932
§ 371 (c)(1), (2), (4) Date: Jul. 29, 2010

(87) PCT Pub. No.: WO2009/099122
PCT Pub. Date: Aug. 13, 2009

(65) Prior Publication Data
US 2010/0321054 A1 Dec. 23, 2010

(30) Foreign Application Priority Data
Feb. 5, 2008 (JP) .................................. 2008-025445

(51) Int. Cl.
*G01R 31/20* (2006.01)
(52) U.S. Cl.
USPC .................................. 324/754.07; 324/754.01
(58) Field of Classification Search
None
See application file for complete search history.

(56) References Cited

U.S. PATENT DOCUMENTS

| | | | | |
|---|---|---|---|---|
| 5,424,651 | A | * | 6/1995 | Green et al. ............ 324/750.05 |
| 6,131,255 | A | * | 10/2000 | Atkins et al. ................ 29/25.01 |
| 6,765,400 | B2 | * | 7/2004 | Ido ............................ 324/756.03 |
| 7,378,860 | B2 | * | 5/2008 | Volkerink et al. ......... 324/754.07 |
| 2001/0047496 | A1 | * | 11/2001 | Hidaka et al. ..................... 714/5 |
| 2004/0012405 | A1 | * | 1/2004 | Cheng et al. .................. 324/761 |
| 2004/0207425 | A1 | * | 10/2004 | Ido ................................ 324/760 |
| 2008/0297185 | A1 | * | 12/2008 | Kang et al. .................... 324/754 |
| 2010/0321053 | A1 | * | 12/2010 | Kameda .................. 324/750.16 |

FOREIGN PATENT DOCUMENTS

| | | |
|---|---|---|
| JP | 61-19142 A | 1/1986 |
| JP | 2-36368 A | 2/1990 |
| JP | 2003273180 A | 9/2003 |
| JP | 2004253561 A | 9/2004 |
| JP | 3793945 B | 7/2006 |
| JP | 3798716 B | 7/2006 |
| JP | 2008300834 A | 12/2008 |

OTHER PUBLICATIONS

International Search Report for PCT/JP2009/051932 mailed May 19, 2009.

* cited by examiner

*Primary Examiner* — Jermele M Hollington

(57) ABSTRACT

A semiconductor inspecting device comprises a probe card for transmitting a signal or power supply to semiconductor wafers having one or more subject chips formed therein, and is constituted such that the first semiconductor wafer faces the first face of the probe card and such that the second semiconductor wafer faces the second face of the probe card on the opposite side of the first face. The probe card includes one or more inspecting chips, which can perform non-contact transmissions with the first subject chip in the first semiconductor wafer and the second subject chip in the second semiconductor wafer.

21 Claims, 23 Drawing Sheets (EXAMPLE 4)
B–B'

FIG. 2 (EXAMPLE 1)

FIG. 5 (EXAMPLE 1)

FIG. 6 (EXAMPLE 1) SINGLE-FACE TYPE

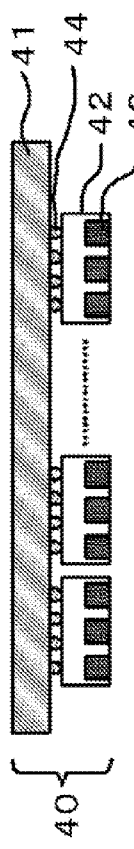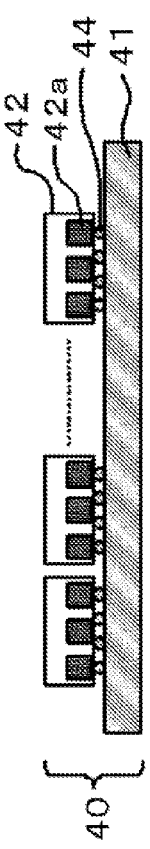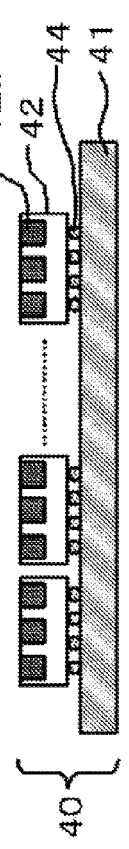

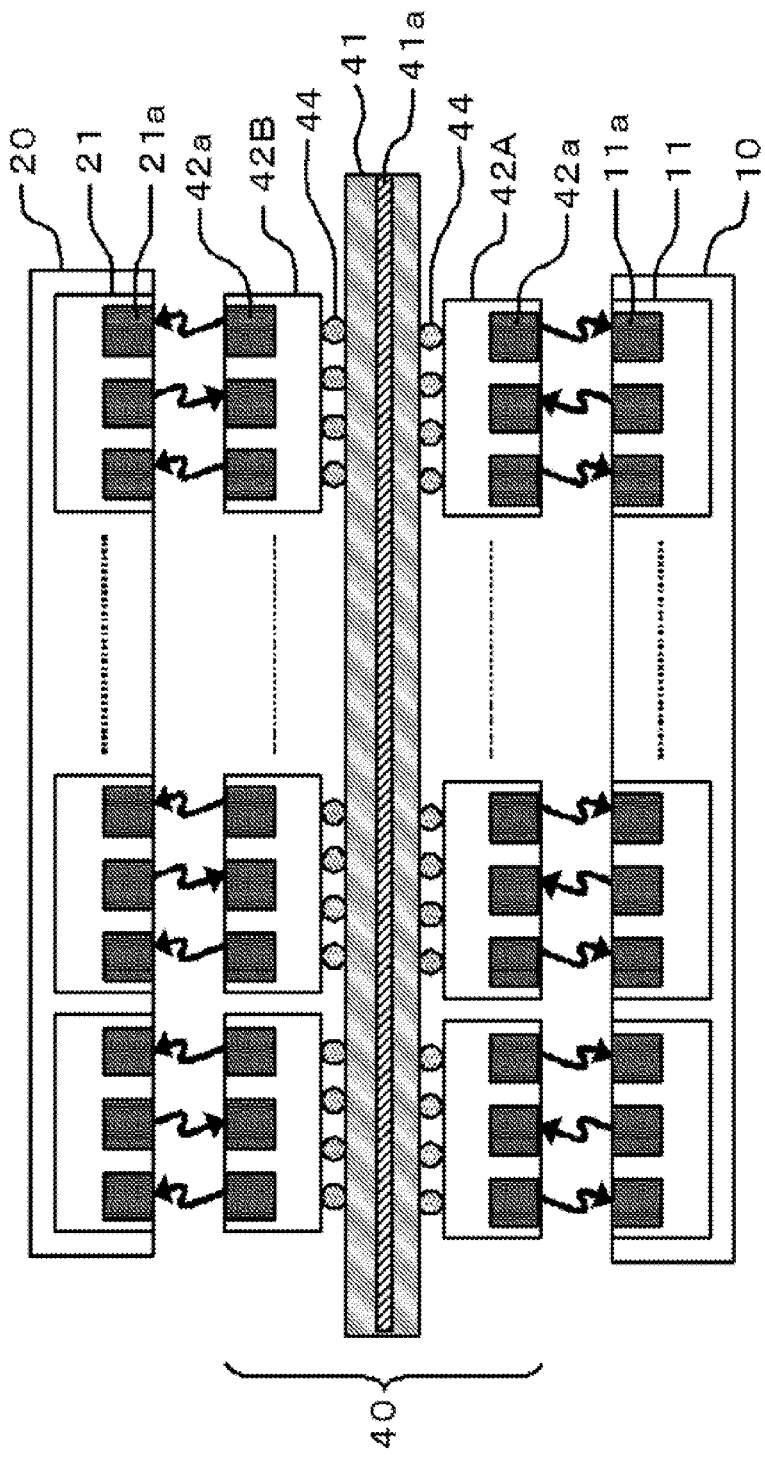

(EXAMPLE 1)
MODIFIED EXAMPLE: DOUBLE-FACE TYPE

FIG. 18 (EXAMPLE 3)

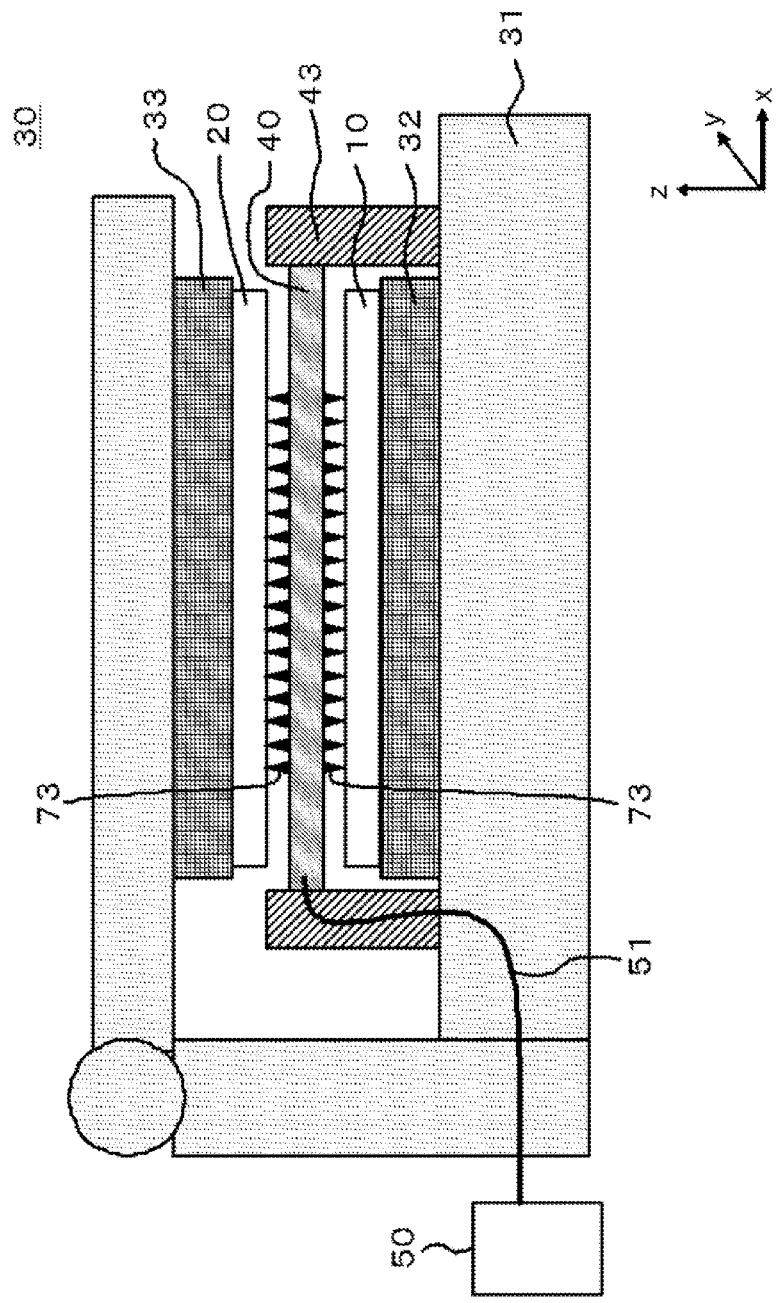
FIG. 22 (EXAMPLE 5)

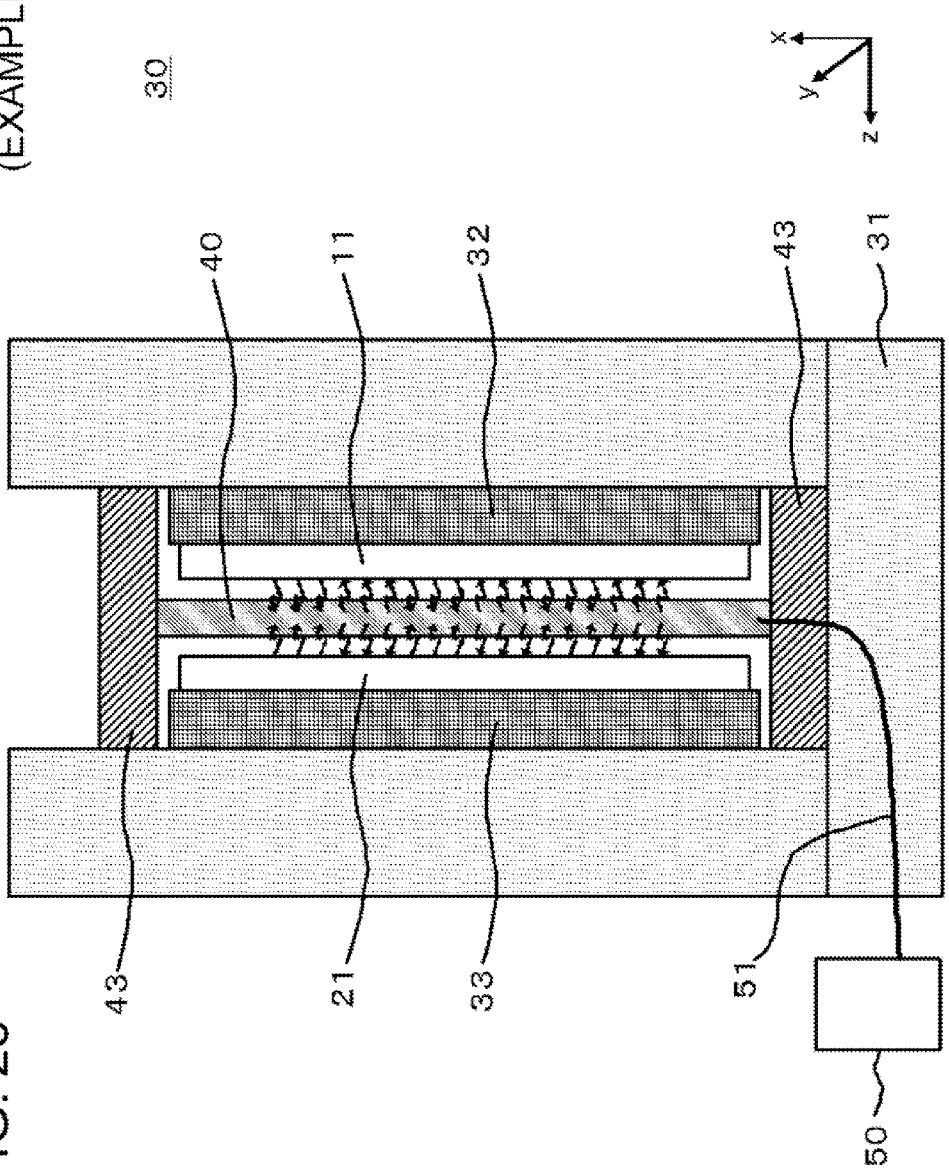
FIG. 23 (EXAMPLE 6)

SEMICONDUCTOR INSPECTING DEVICE AND SEMICONDUCTOR INSPECTING METHOD

CROSS-REFERENCE TO RELATED APPLICATION

The present invention is the National Phase of PCT/JP2009/051932, filed Feb. 5, 2009, which is based upon and claims the benefit of the priority of Japanese patent application No. 2008-025445 filed on Feb. 5, 2008, the disclosure of which is incorporated herein in its entirety by reference thereto.

TECHNICAL FIELD

The present invention relates to a semiconductor inspecting device and semiconductor inspecting method that inspect a semiconductor wafer, and particularly to a semiconductor inspecting device and semiconductor inspecting method that inspect two semiconductor wafers simultaneously.

BACKGROUND

Conventionally, a semiconductor inspecting device that inspects a semiconductor wafer generally uses a contact-type method in which an inspection is performed by having a probe pin contact a pad on the semiconductor wafer, however, in recent years, a non-contact-type method in which an inspection is performed by means of wireless communication or capacitive coupling with the subject chips in the semiconductor wafer without contacting them has been used since the semiconductor wafer may get damaged or it is difficult to adjust the contact pressure in the contact-type method.

For instance, Patent Document 1 discloses a non-contact signal transmission method using wireless communication that performs inspection by using semiconductor chips (the subject chips) having communication coils formed therein in the semiconductor wafer, wirelessly transmitting an inspection signal from the head of the semiconductor inspecting device to the communication coils, and transmitting the inspection results from the communication coils to the head after the functions of the semiconductor chips that received the inspection signal have been inspected. In this method, each semiconductor chip in the semiconductor wafer is inspected by moving the head or the semiconductor wafer.

Further, Patent Document 2 discloses a non-contact signal transmission method using capacitive coupling in which a sensor is formed so as to face a signal line of an LSI chip that one attempts to monitor in a voltage probe chip, the sensor is covered with a dielectric film, and each chip is inspected by having the voltage probe chip detect voltage changes of the signal line of the LSI chip as an induced electromotive force caused by electrostatic induction.

Further, Patent Document 3 discloses a wafer inspecting device using non-contact signal transmission that comprises a data transmitting/receiving unit that faces a subject wafer in a non-contact state and a tester connected to the data transmitting/receiving unit, starts an inspection when the subject wafer receives an inspection signal from the data transmitting/receiving unit, and has the subject wafer transmit the inspection results to the data transmitting/receiving unit after the inspection is completed.

[Patent Document 1] Japanese Patent No. 3798716
[Patent Document 2] Japanese Patent No. 3793945
[Patent Document 3] Japanese Patent Kokai Publication No. JP-P2004-253561A

SUMMARY

The entire disclosures of Patent Documents 1 to 3 are incorporated herein by reference thereto.

The following analysis is given from the perspective of the present invention.

In the inspection of semiconductor wafers, an increase in inspection costs has become an issue as subject chips has become smaller and more complex. Increasing the number of chips measured simultaneously, i.e., reducing the inspection time per chip, is one way to reduce inspection costs. However, since the conventional methods can inspect only one semiconductor wafer at a time and cannot simultaneously inspect chips more than the number of chips formed in a semiconductor wafer, these methods are limited in terms of reducing the inspection time per chip. Meanwhile, the number of chips inspected simultaneously can be increased by having a plurality of semiconductor inspecting devices operate in parallel, however, adding more semiconductor inspecting devices will increase the cost.

It is a main object of the present invention to reduce the inspection cost per chip without increase in the inspecting device.

In a first aspect of the present invention, there is provided a semiconductor inspecting device for inspecting semiconductor wafers, which comprises a probe card that transmits a signal or power supply to semiconductor wafers having one or more inspecting chips formed therein, a first semiconductor wafer faces a first face of the probe card, and a second semiconductor wafer faces a second face opposite to the first face of the probe card.

In a second aspect of the present invention, there is provided a semiconductor inspecting method for inspecting semiconductor wafers, which includes: causing a probe card disposed between a first semiconductor wafer and a second semiconductor wafer simultaneously to transmit an inspection signal to both a first subject chip formed in the first semiconductor wafer and a second subject chip formed in the second semiconductor wafer; and causing the first subject chip and the second subject chip that have received the inspection signal to transmit the respective inspection results to the probe card simultaneously or sequentially.

In a third aspect of the present invention, there is provided a semiconductor inspecting method for inspecting semiconductor wafers, which includes: causing a first inspecting chip disposed on a side of a probe card, disposed between a first semiconductor wafer and a second semiconductor wafer, closer to the first semiconductor wafer and a second inspecting chip disposed on a side of the probe card closer to the second semiconductor wafer, simultaneously or independently to transmit an inspection signal to a first subject chip formed in the first semiconductor wafer and to a second subject chip formed in the second semiconductor wafer respectively; and causing the first subject chip and the second subject chip that have received the inspection signal simultaneously or independently to transmit the inspection results to the first inspecting chip and to the second inspecting chip respectively.

In a fourth aspect of the present invention, there is provided a semiconductor device manufacturing method that includes the steps of the semiconductor inspecting methods above.

According to the present invention, the number of chips simultaneously inspected can be increased and the inspection time per chip can be reduced without increasing the number of inspecting devices by disposing semiconductor wafers having subject chips formed therein on both faces of a probe card. As a result, the inspection cost can be reduced. Further, the size of the inspecting device per wafer can be reduced.

BRIEF DESCRIPTION OF THE DRAWINGS

FIGS. 9A, 9B, and 9C are cross-sections schematically showing variations of the single-face type probe card in the semiconductor inspecting device relating to Example 1 of the present invention.

FIG. 10 is a cross-section schematically showing the arrangement (double-face type) of the non-contact transmission electrodes of the probe card and the semiconductor wafers in the semiconductor inspecting device relating to Example 1 of the present invention.

FIG. 22 is a cross-section schematically showing the configuration of a semiconductor inspecting device relating to Example 5 of the present invention.

FIG. 23 is a drawing schematically showing the configuration of a semiconductor inspecting device relating to Example 6 of the present invention.

Figure 1:
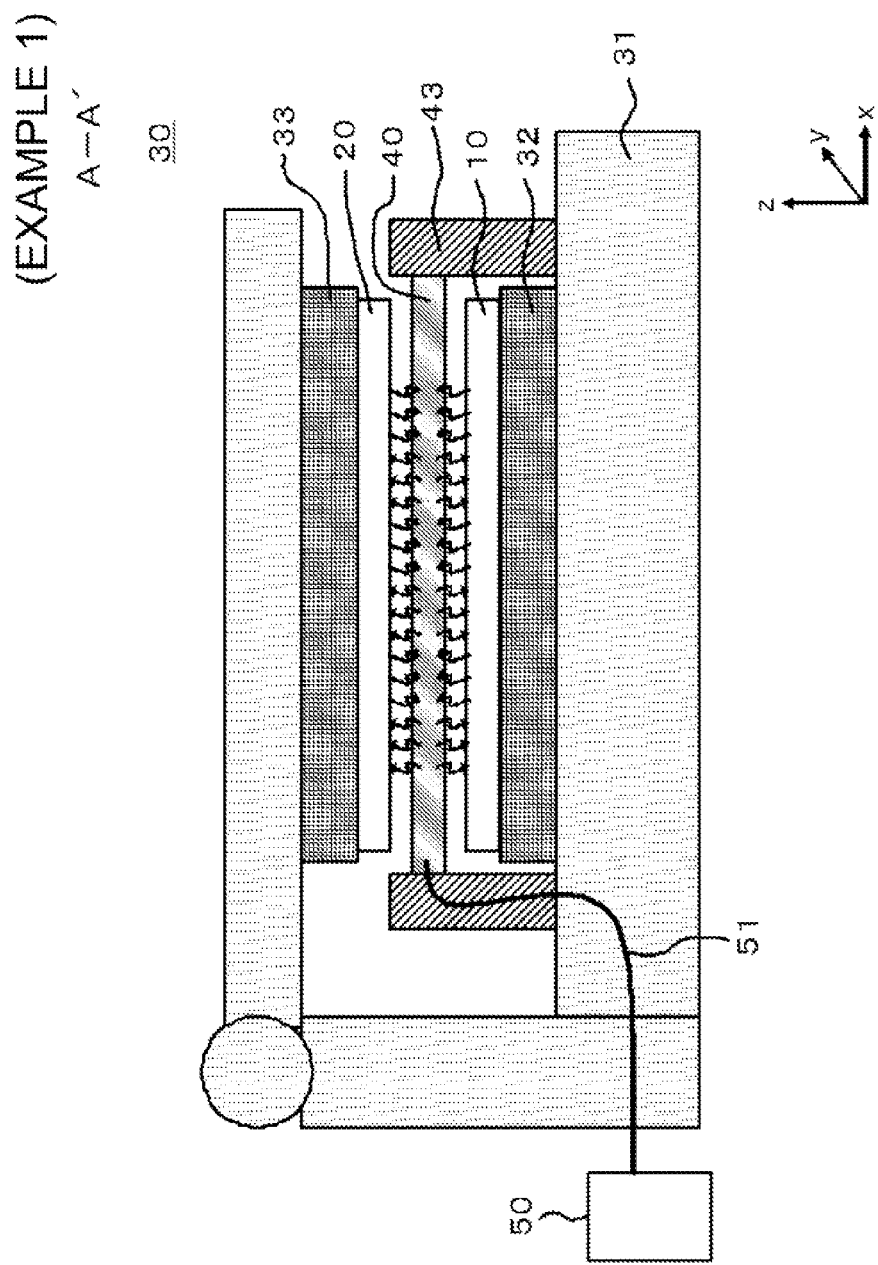
FIG. 1 is a cross-section, along line A-A' in FIG. 2, schematically showing the configuration of a semiconductor inspecting device relating to Example 1 of the present invention.

As for explanation of symbols, refer to the end of the specification.

PREFERRED MODES

A semiconductor inspecting device relating to Mode 1 of the present invention comprises a probe card (40 in FIG. 6) that transmits a signal or power supplies to semiconductor wafers (10 and 20 in FIG. 6) having one or more subject chips (11 and 21 in FIG. 6) formed therein, and is constituted such that a first semiconductor wafer (10 in FIG. 6) faces a first face of the probe card (40 in FIG. 6) and that a second semiconductor wafer (20 in FIG. 6) faces a second face of the probe card (40 in FIG. 6) on the opposite side of the first face (Mode 1).

Further, other modes below are possible.

It is preferable that the probe card comprise one or more inspecting chips capable of performing non-contact transmission to the first subject chip in the first semiconductor wafer and the second subject chip in the second semiconductor wafer (Mode 1-1).

It is preferable that the first and the second subject chips include at least one non-contact transmission electrode that performs non-contact transmission of a signal or power supply and that the inspecting chip include at least one non-contact transmission electrode that performs non-contact transmission of a signal or power supply to the non-contact transmission electrode of the first or the second subject chips or to the non-contact transmission electrodes of the both chips (Mode 1-2).

It is preferable that the probe card have the inspecting chip mounted on one face of a substrate (Mode 1-3).

It is preferable that the non-contact transmission electrode of the inspecting chip be disposed on a face of the inspecting chip on the side of the substrate or on the opposite face thereof (Mode 1-4).

It is preferable that the probe card have the inspecting chips mounted on both sides of a substrate (Mode 1-5).

It is preferable that the non-contact transmission electrode of the first inspecting chip mounted on the first face of the substrate be disposed on a face of the first inspecting chip on the side of the substrate or on the opposite face thereof, and that the non-contact transmission electrode of the second inspecting chip mounted on the second face on the opposite side to the first face of the substrate be disposed on a face of the second inspecting chip on the side of the substrate or on the opposite face thereof (Mode 1-6).

It is preferable that the substrate have a metal layer that magnetically shields between the first inspecting chip and the second inspecting chip built therein (Mode 1-7).

It is preferable that the probe card have the inspecting chip embedded in a substrate (Mode 1-8).

It is preferable that the probe card comprise a substrate that includes at least one non-contact transmission electrode that performs non-contact transmission of a signal or power supply to the non-contact transmission electrode of the first or the second subject chip or to the non-contact transmission electrodes of the both chips, and that the non-contact transmission electrode(s) of the substrate be electrically connected to the inspecting chip (Mode 1-9).

It is preferable that the non-contact transmission electrode (s) of the substrate be disposed on a face of the substrate on the side of the first subject chip or a face on the side of the second subject chip or on the both faces (Mode 1-10).

It is preferable that the non-contact transmission electrode (s) of the first semiconductor wafer be disposed on a face of the first semiconductor wafer on the side of the probe card or on the opposite face thereof, and that the non-contact transmission electrode of the second semiconductor wafer be disposed on a face of the second semiconductor wafer on the side of the probe card or on the opposite face thereof (Mode 1-11).

It is preferable that the non-contact transmission electrode (s) be a communication coil (Mode 1-12).

It is preferable that the non-contact transmission electrode (s) be a conductor layer for capacitive coupling (Mode 1-13).

It is preferable that an insulator be interposed between the probe card and either the first semiconductor wafer or the second semiconductor wafer or both (Mode 1-14).

It is preferable that the first semiconductor wafer or the second semiconductor wafer or both comprise an electrode(s) disposed in a region where the subject chip is not disposed and electrically connected to each of the subject chips, and that a probe needle(s) that contacts the electrode(s) and supplies power or a signal to the electrode(s) be provided (Mode 1-15).

It is preferable that the probe card have a plurality of probe pins disposed on one face or both faces, and that the probe pins are arranged in such a manner that they contact the first semiconductor wafer or the second semiconductor wafer or both (Mode 1-16).

It is preferable that the first semiconductor wafer and the second semiconductor wafer be of the same type or different types (Mode 1-17).

It is preferable that a card support base that detachably supports the probe card, a first wafer stage that supports the first semiconductor wafer, and a second wafer stage that supports the second semiconductor wafer be provided, and that at least two of the card support base, the first wafer stage, and the second wafer stage have a positioning mechanism (Mode 1-18).

It is preferable that the probe card, the first semiconductor wafer, and the second semiconductor wafer be disposed perpendicular to a horizontal plane (Mode 1-19).

A semiconductor inspecting method relating to Mode 2 of the present invention includes: causing a probe card (40 in FIG. 6) disposed between a first semiconductor wafer (10 in FIG. 6) and a second semiconductor wafer (20 in FIG. 6) simultaneously to transmit an inspection signal to both a first subject chip (11 in FIG. 6) formed in the first semiconductor wafer (10 in FIG. 6) and a second subject chip (21 in FIG. 21) formed in the second semiconductor wafer (20 in FIG. 6); and causing the first subject chip (11 in FIG. 6) and the second subject chip (21 in FIG. 6) that have received the inspection signal to transmit the respective inspection results to the probe card (40 in FIG. 6) simultaneously or sequentially (Mode 2).

Further, other modes below are possible.

It is preferable to include: causing a probe card disposed between a first semiconductor wafer and a second semiconductor wafer simultaneously to transmit an inspection signal to both a first subject chip formed in the first semiconductor wafer and a second subject chip formed in the second semiconductor wafer; and causing the first subject chip and the second subject chip that have received the inspection signal to transmit the respective inspection results to the probe card simultaneously or sequentially (Mode 2-1).

It is preferable to include: causing a first inspecting chip disposed on a side of a probe card, disposed between a first semiconductor wafer and a second semiconductor wafer, closer to the first semiconductor wafer and a second inspecting chip disposed on a side of the probe card closer to the second semiconductor wafer simultaneously or independently to transmit an inspection signal to a first subject chip formed in the first semiconductor wafer and to a second subject chip formed in the second semiconductor wafer respectively; and causing the first subject chip and the second subject chip that have received the inspection signal simultaneously or independently to transmit the inspection results to the first inspecting chip and to the second inspecting chip respectively (Mode 2-2).

A semiconductor inspecting method relating to Mode 3 of the present invention includes: causing a first inspecting chip (42A in FIG. 10) disposed on a side of a probe card (40 in FIG. 10), disposed between a first semiconductor wafer (10 in FIG. 10) and a second semiconductor wafer (20 in FIG. 10), closer to the first semiconductor wafer (10 in FIG. 10) and a second inspecting chip (42B in FIG. 10) disposed on a side of the probe card (40 in FIG. 10) closer to the second semiconductor wafer (20 in FIG. 10) simultaneously or independently to transmit an inspection signal to a first subject chip (11 in FIG. 10) formed in the first semiconductor wafer (10 in FIG. 10) and to a second subject chip (21 in FIG. 10) formed in the second semiconductor wafer (20 in FIG. 10) respectively; and causing the first subject chip (11 in FIG. 10) and the second subject chip (21 in FIG. 10) that have received the inspection signal simultaneously or independently to transmit the inspection results to the first inspecting chip (42A in FIG. 10) and to the second inspecting chip (42B in FIG. 10) respectively (Mode 3).

EXAMPLE 1

Figure 2:
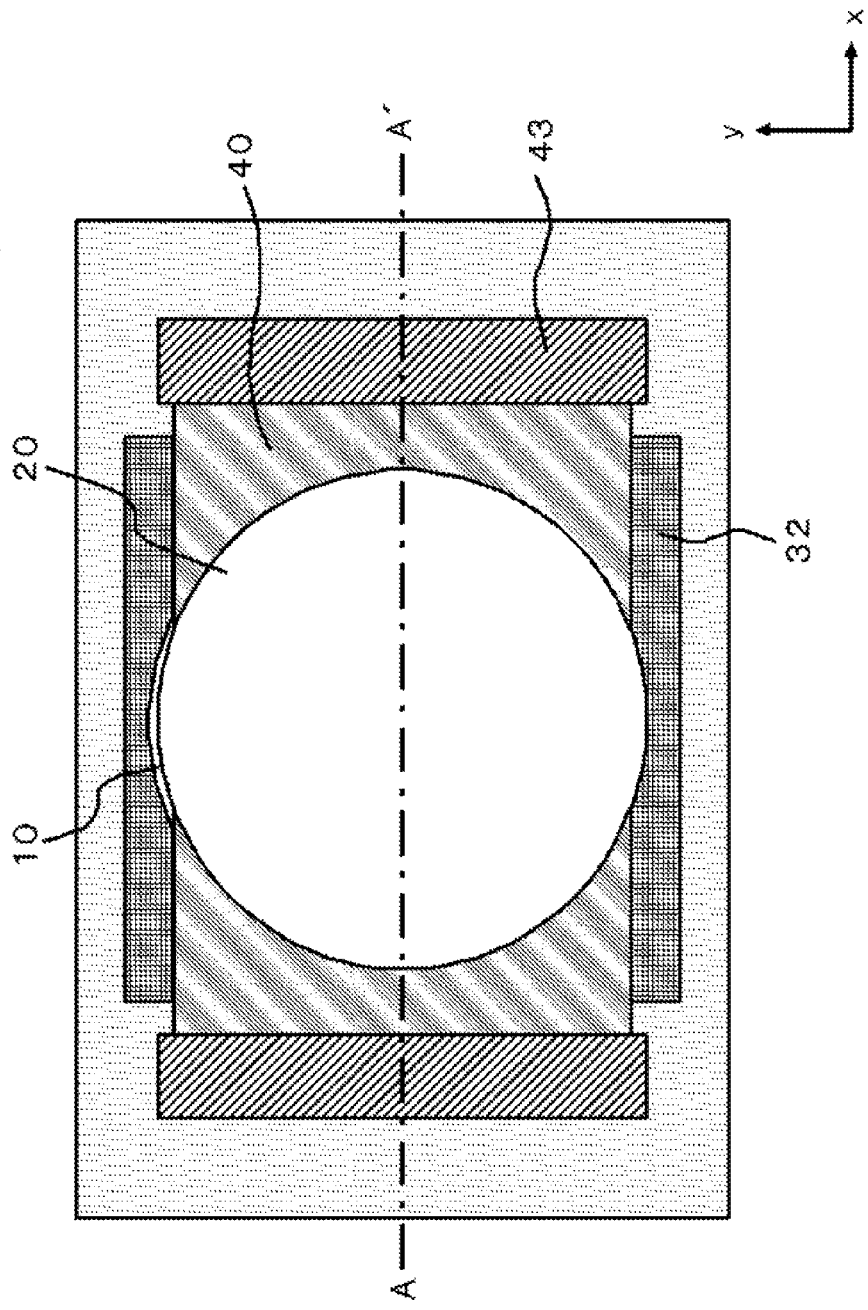
FIG. 2 is a plan schematically showing the configuration of the semiconductor inspecting device relating to Example 1 of the present invention and viewed from the side of a second semiconductor wafer.

A semiconductor inspecting device relating to Example 1 of the present invention will be described with reference to the drawings. FIG. 1 is a cross-section, along line A-A' in FIG. 2, schematically showing the configuration of the semiconductor inspecting device relating to Example 1 of the present invention. FIG. 2 is a plan schematically showing the configuration of the semiconductor inspecting device relating to Example 1 of the present invention and viewed from the side of the second semiconductor wafer. Note that a second stage 33 and the head of a prober 31 in FIG. 1 are not shown in FIG. 2.

With reference to FIGS. 1 and 2, the semiconductor inspecting device 30 is capable of inspecting two semiconductor wafers 10 and 20 simultaneously. The semiconductor inspecting device 30 comprises the prober 31, a first stage 32, the second stage 33, the probe card 40, and the probe card support base 43.

The prober 31 is a portion in which a base that holds the first stage 32 and the probe card support base 43 and the head that holds the second stage 33 are pivotably connected.

The first stage 32 holds the first semiconductor wafer 10 disposed underneath the probe card 40. The first stage 32 is fixed onto the base of the prober 31. As a positioning mechanism of the first semiconductor wafer 10, the first stage 32 moves in the x-, y-, and z-axis directions, rotates in the x-y plane, and tilts in the x-y plane. Note that the first stage 32 does not have to possess the positioning mechanism if the probe card support base 43 and the second stage 33 both have a positioning mechanism. The first stage 32 comprises vacuum suction means or holding means as means for fixing the first semiconductor wafer 10 on the stage.

The second stage 33 holds the second semiconductor wafer 20 disposed on top of the probe card 40. The second stage 33 is fixed onto the head of the prober 31. As a positioning mechanism of the second semiconductor wafer 20, the second stage 33 moves in the x-, y-, and z-axis directions, rotates in the x-y plane, and tilts in the x-y plane. Note that the second stage 33 does not have to possess the positioning mechanism if the probe card support base 43 and the first stage 32 both have a positioning mechanism. The second stage 33 comprises vacuum suction means or holding means as a means that fixes the second semiconductor wafer 20 on the stage.

The probe card 40 is a card-shaped part with a function of performing non-contact transmission of power supply or a signal or both to the semiconductor wafers 10 and 20. Regarding a configuration in which power supply or a signal or both is transmitted by having the probe pin contact the wafers, refer to Example 5 (FIG. 22). The probe card 40 is detachably supported by the probe card support base 43 at its periphery. The probe card 40 is electrically connected to a tester 50 via the probe card support base 43 and a wiring 51 disposed in the prober 31. The configuration of the probe card 40 will be described in detail later.

The probe card support base 43 detachably supports the probe card 40. The probe card support base 43 is fixed on the base of the prober 31. As a positioning mechanism of the probe card 40, the probe card support base 43 moves in the x-, y-, and z-axis directions, rotates in the x-y plane, and tilts in the x-y plane. Note that the probe card support base 43 does not have to possess the positioning mechanism if the first and the second stages 32 and 33 both have a positioning mechanism. The probe card support base 43 may be detachable from the base of the prober 31.

The first semiconductor wafer 10 is disposed underneath the probe card 40 and is held on top of the first stage 32. The second semiconductor wafer 20 is disposed on top of the probe card 40 and is held underneath the second stage 33. The first and second semiconductor wafers 10 and 20 do not have to be of the same size. The semiconductor wafers 10 and 20 have a function of performing non-contact communication with the probe card 40. The detailed configuration of the semiconductor wafers 10 and 20, and the operation during inspection will be described later.

The tester 50 performs testing on the semiconductor wafers 10 and 20 via the probe card 40. The operation of the tester 50 will be described later.

Figure 3:
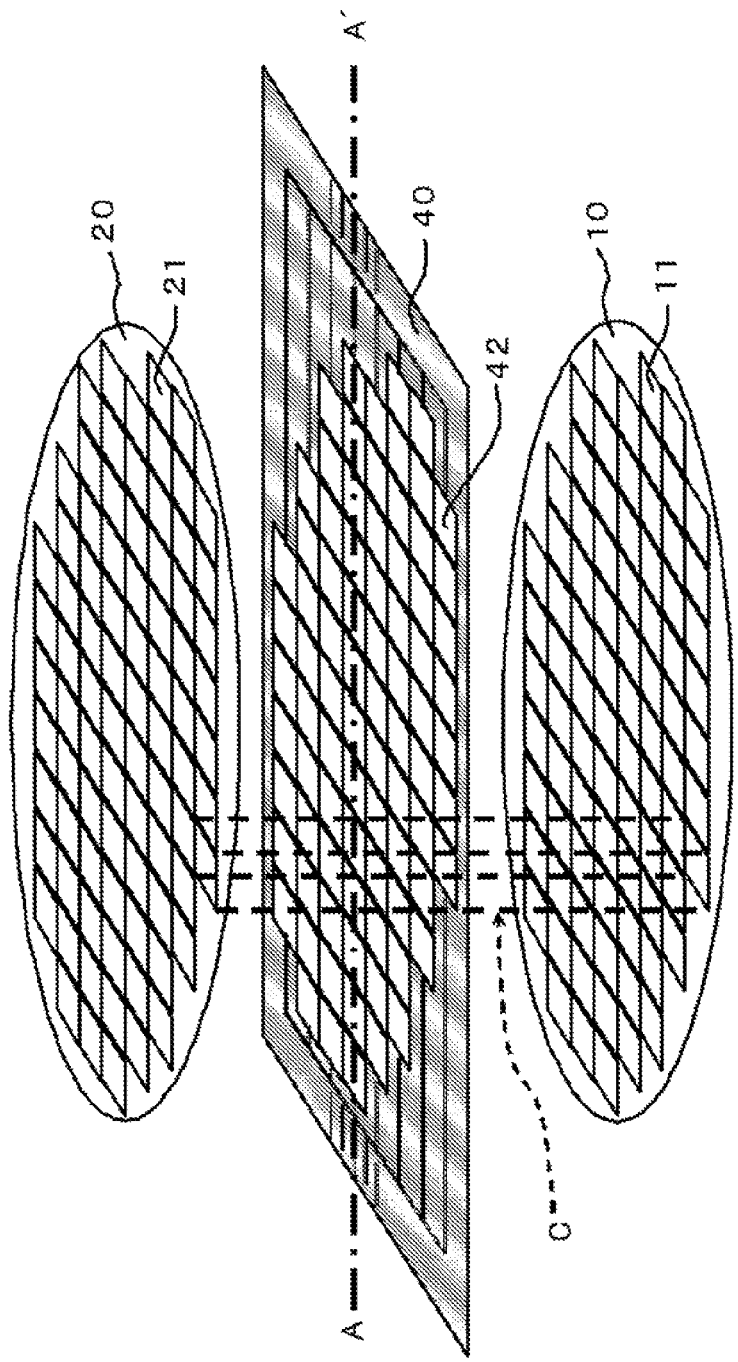
FIG. 3 is a perspective schematically showing the configuration of a probe card and semiconductor wafers in the semiconductor inspecting device relating to Example 1 of the present invention.
Figure 4:
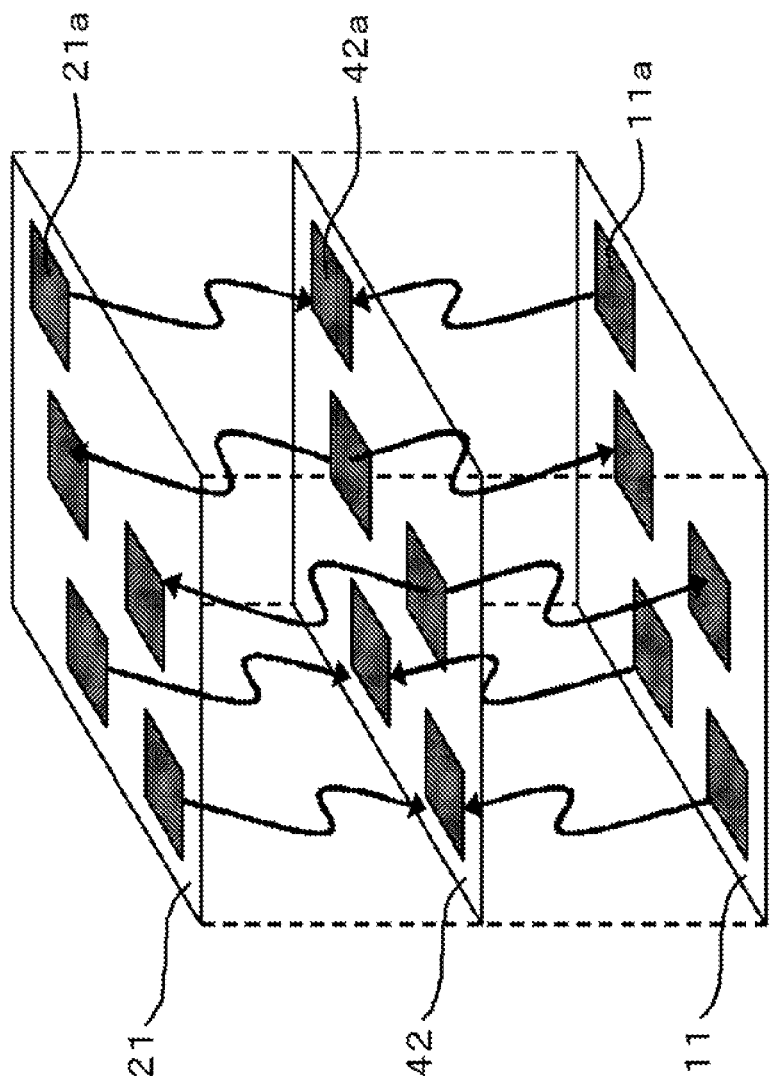
FIG. 4 is a perspective schematically showing the configuration of inspecting chips of the probe card and subject chips of the semiconductor wafers in the semiconductor inspecting device relating to Example 1 of the present invention.
Figure 5:
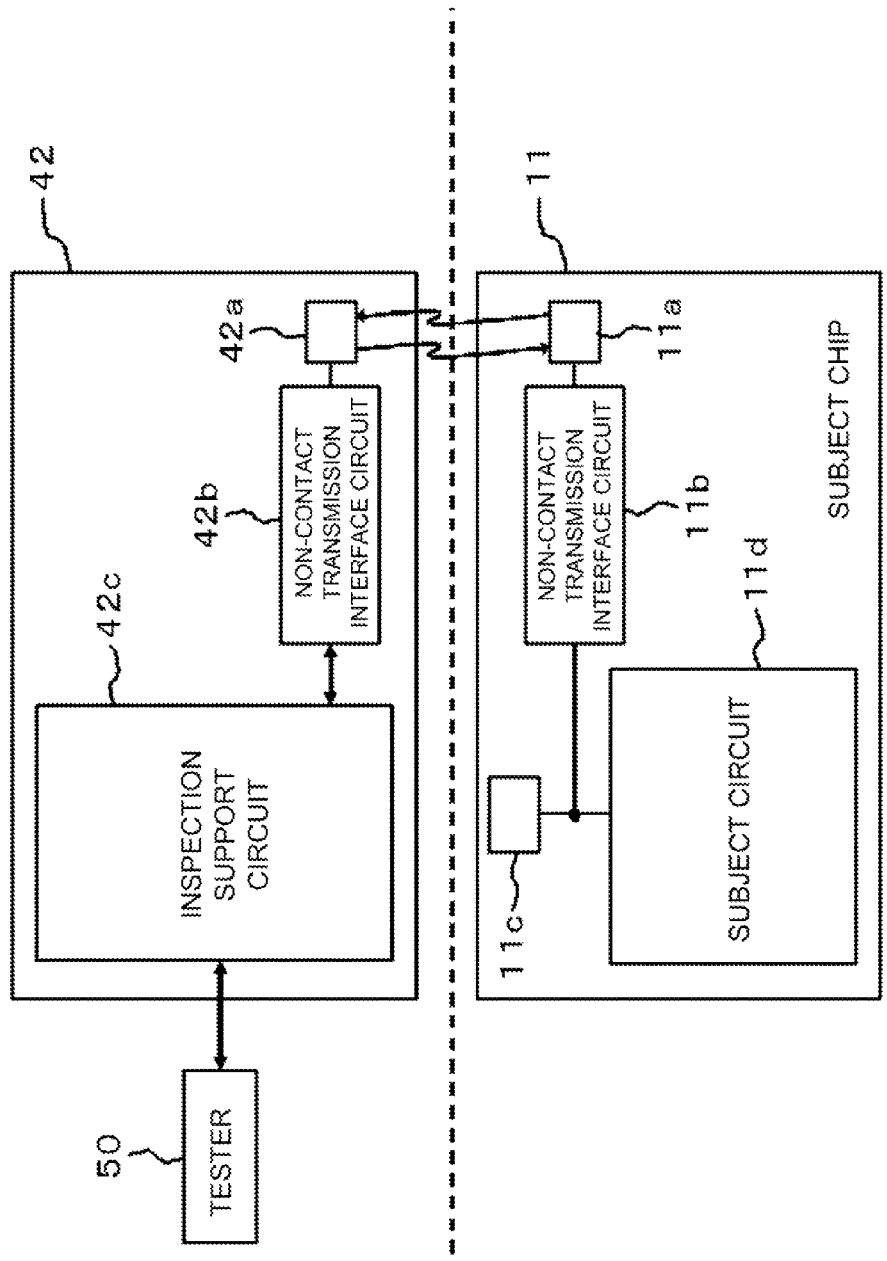
FIG. 5 is a block diagram schematically showing the circuit configurations of the inspecting chip of the probe card and the subject chip of the semiconductor wafer in the semiconductor inspecting device relating to Example 1 of the present invention.

Next, the configurations of the probe card and the semiconductor wafers in the semiconductor inspecting device relating to Example 1 of the present invention will be described with reference to the drawings. FIG. 3 is a perspective schematically showing the configuration of the probe card and the semiconductor wafers in the semiconductor inspecting device relating to Example 1 of the present invention. FIG. 4 is a perspective schematically showing the configuration of the inspecting chips of the probe card and the subject chips of the semiconductor wafers in the semiconductor inspecting device relating to Example 1 of the present invention. FIG. 5 is a block diagram schematically showing the circuit configurations of the inspecting chip of the probe card and the subject chip of the semiconductor wafer in the semiconductor inspecting device relating to Example 1 of the present invention.

With reference to FIG. 3, the first semiconductor wafer 10 comprises a plurality of the subject chips 11. The second semiconductor wafer 20 comprises a plurality of the subject chips 21. The probe card 40 comprises a plurality of the inspecting chips 42. The first semiconductor wafer 10, the second semiconductor wafer 20, and the probe card 40 are positioned so that an inspecting chip 42 corresponds to a subject chip 11 and a subject chip 21. Note that the sizes of the subject chips 11 and 21 and the inspecting chips 42 do not necessarily have to be the same. Further, the first subject chips 11 of the first semiconductor wafer 10 and the second subject chips 21 of the second semiconductor wafer 20 do not necessarily have to be configured identically since there are cases where their functions are partially identical and they partially share inspection vectors.

With reference to FIG. 4, the non-contact transmission electrode 42a that performs electrically non-contact transmission of power supply and a signal is formed on the inspecting chip 42 at a predetermined location. On the subject chip 11, the non-contact transmission electrode 11a that performs electrically non-contact transmission of power supply and a signal is formed at a location corresponding to the location of the non-contact transmission electrode 42a on the inspecting chip 42. On the subject chip 21, the non-contact transmission electrode 21a that performs electrically non-contact transmission of power supply and a signal is formed at a location corresponding to the location of the non-contact transmission electrode 42a on the inspecting chip 42. When the inspecting chip 42 corresponds to the subject chips 11 and 21, one non-contact transmission electrode 42a corresponds to one non-contact transmission electrode 11a and one non-contact transmission electrode 21a. The non-contact transmission electrode 42a is capable of simultaneously transmitting a signal and power supply with both the non-contact transmission electrodes 11a and 21a.

With reference to FIG. 5, the inspecting chip 42 comprises the non-contact transmission electrodes 42a, a non-contact transmission interface circuit 42b, and an inspection support circuit 42c. The non-contact transmission electrode 42a is a communication coil that performs electrically non-contact transmission of power supply and a signal to the non-contact transmission electrode 11a (and the non-contact transmission electrode 21a in FIG. 4). The non-contact transmission interface circuit 42b converts the transmission formats of power supply and a signal outputted from the inspection support circuit 42c to the non-contact transmission electrode 42a and also converts the transmission formats of power supply and a signal outputted from the non-contact transmission electrode 42a to the inspection support circuit 42c. The inspection support circuit 42c supports the inspection on the subject chip 11 (and the subject chip 21 in FIG. 4) performed by the tester 50, performs predetermined processing on a signal from the tester 50 and outputs the resultant signal to the non-contact transmission interface circuit 42b, and performs predetermined processing on a signal from the non-contact transmission interface circuit 42b and outputs the resultant signal to the tester 50.

With reference to FIG. 5, the subject chip 11 comprises the non-contact transmission electrode 11a, a non-contact transmission interface circuit 11b, a pad 11c, and a subject circuit 11d. The non-contact transmission electrode 11a is a communication coil that performs electrically non-contact transmission of power supply and a signal to the non-contact transmission electrode 42a. The non-contact transmission interface circuit 11b converts the transmission formats of power supply and a signal outputted from the subject circuit 11d to the non-contact transmission electrode 11a and also converts the transmission formats of power supply and a signal outputted from the non-contact transmission electrode 11a to the subject circuit 11d. The pad 11c is an input/output electrode pad of the subject circuit 11d. The subject circuit 11d is a circuit that becomes the subject of inspection and receives/outputs a signal and power supply between the non-contact transmission interface circuit 11b and the pad 11c.

Next, the arrangement of the non-contact transmission electrodes of the probe card and the semiconductor wafers in the semiconductor inspecting device relating to Example 1 of the present invention will be described with reference to the drawings. FIGS. 6 to 8, and FIG. 10 are cross-sections schematically showing the arrangement of the non-contact transmission electrodes of the probe card and the semiconductor wafers in the semiconductor inspecting device relating to Example 1 of the present invention. FIG. 9 and FIGS. 11 to 13 are cross-sections schematically showing variations of the probe card in the semiconductor inspecting device relating to Example 1 of the present invention.

Figure 6:
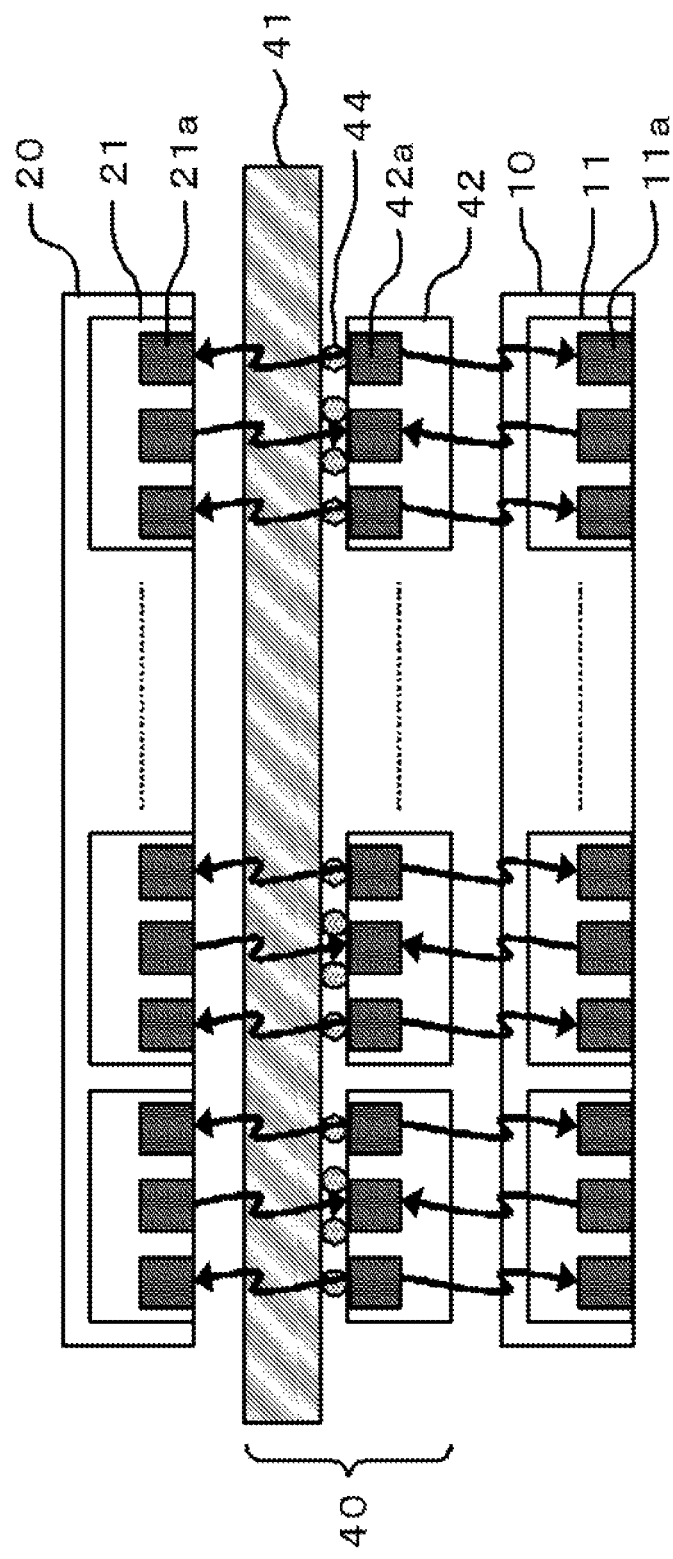
FIG. 6 is a cross-section schematically showing the arrangement (single-face type) of non-contact transmission electrodes of the probe card and the semiconductor wafers in the semiconductor inspecting device relating to Example 1 of the present invention.

With reference to FIG. 6 as an example (single-face type) in which the probe card 40 has the inspecting chip 42 mounted on a single face of a probe card substrate 41, the probe card 40 has the inspecting chip 42 flip-chip bonded to a face of the probe card substrate 41 (board) on the side of the first semiconductor wafer 10 via bumps 44, and non-contact transmission electrodes 42a are disposed on a face of the inspecting chip 42 on the side of the probe card substrate 41. The first semiconductor wafer 10 has the non-contact transmission electrodes 11a disposed on a face of the first semiconductor wafer 10 opposite to the side of the probe card substrate 41. The second semiconductor wafer 20 has non-contact transmission electrodes 2 1a disposed on a face of the second semiconductor wafer 20 on the side of the probe card substrate 41.

Figure 7:
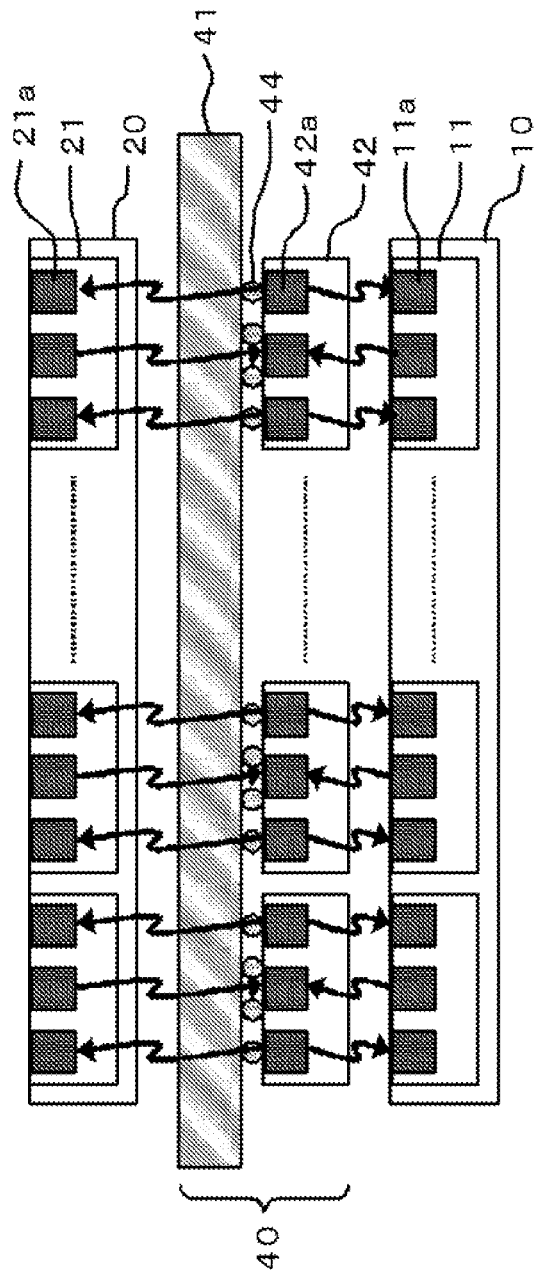
FIG. 7 is a cross-section schematically showing a first variation of the arrangement (single-face type) of the non-contact transmission electrodes of the probe card and the semiconductor wafers in the semiconductor inspecting device relating to Example 1 of the present invention.

With reference to FIG. 7 as a variation (single-face type) relating to the arrangement of the semiconductor wafers 10 and 20, the probe card 40 has the inspecting chip 42 flip-chip bonded to a face of the probe card substrate 41 (board) on the side of the first semiconductor wafer 10 via the bumps 44, and the non-contact transmission electrodes 42a are disposed on a face of the inspecting chip 42 on the side of the probe card substrate 41. The first semiconductor wafer 10 has non-contact transmission electrodes 1I a disposed on a face of the first semiconductor wafer 10 on the side of the probe card substrate 41. The second semiconductor wafer 20 has the non-contact transmission electrodes 21a disposed on a face of the second semiconductor wafer 20 opposite to the side of the probe card substrate 41.

Figure 8:
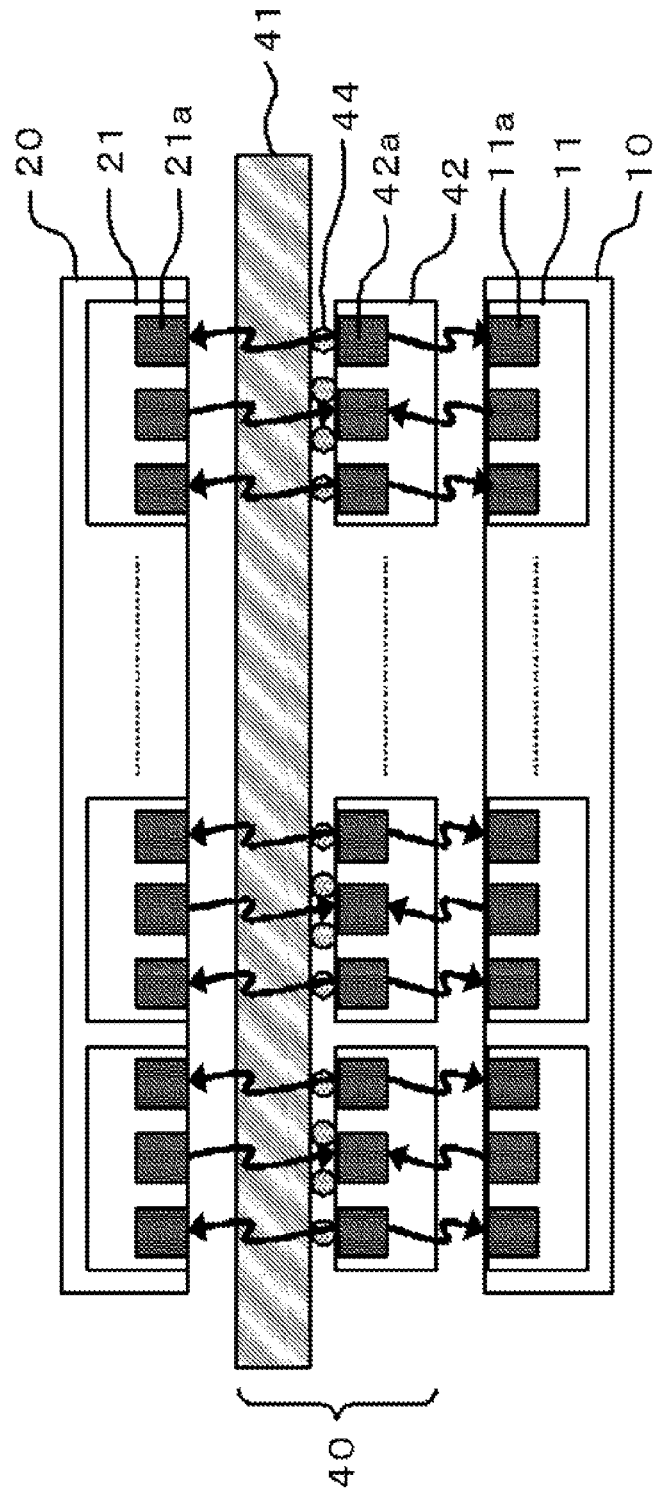
FIG. 8 is a cross-section schematically showing a second variation of the arrangement (single-face type) of the non-contact transmission electrodes of the probe card and the semiconductor wafers in the semiconductor inspecting device relating to Example 1 of the present invention.

With reference to FIG. 8 as a variation (single-face type) relating to the arrangement of the semiconductor wafers 10 and 20, the probe card 40 has the inspecting chip 42 flip-chip bonded to a face of the probe card substrate 41 (board) on the side of the first semiconductor wafer 10 via the bumps 44, and the non-contact transmission electrodes 42a are disposed on a face of the inspecting chip 42 on the side of the probe card substrate 41. The first semiconductor wafer 10 has the non-contact transmission electrodes 11a disposed on a face of the first semiconductor wafer 10 on the side of the probe card substrate 41. The second semiconductor wafer 20 has the non-contact transmission electrodes 21a disposed on a face of the second semiconductor wafer 20 on the side of the probe card substrate 41. In the example shown in FIG. 8, since the positional relation between the non-contact transmission electrodes 42a of the inspecting chip 42 and the non-contact transmission electrodes 11a of the first subject chip 11 and the positional relation between the non-contact transmission electrodes 42a of the inspecting chip 42 and the non-contact transmission electrodes 21a of the second subject chip 21 are different, the first semiconductor wafer 10 and the second semiconductor wafer 20 must be symmetrical with respect to the positions of the non-contact transmission electrodes 11a and 21a.

With reference to FIG. 9A as a variation relating to the single-face type probe card 40, the probe card 40 has inspecting chips 42 mounted on the lower face of the probe card substrate 41 (board) as in FIGS. 6 to 8, however, the non-contact transmission electrodes 42a may be disposed on a face of the inspecting chip 42 opposite to the side of the probe card substrate 41. Further, with reference to FIG. 9B, the probe card 40 may have the inspecting chips 42 mounted on the upper, face of the probe card substrate 41 (board), and the non-contact transmission electrodes 42a may be disposed on a face of the inspecting chip 42 on the side of the probe card substrate 41. Further, with reference to FIG. 9C, the probe card 40 may have the inspecting chips 42 mounted on the upper face of the probe card substrate 41 (board), and the non-contact transmission electrodes 42a may be disposed on a face of the inspecting chip 42 opposite to the side of the probe card substrate 41.

With reference to FIG. 10 as an example (double-face type) in which the probe card 40 has the inspecting chips 42 mounted on both faces of the probe card substrate 41, the probe card 40 has the inspecting chips 42A flip-chip bonded to a face of the probe card substrate 41 (board) on the side of the first semiconductor wafer 10 via the bumps 44, and the non-contact transmission electrodes 42a are disposed on a face of the inspecting chip 42 opposite to the side of the probe card substrate 41. Further, the probe card 40 has the inspecting chips 42B flip-chip bonded to a face of the probe card substrate 41 (board) on the side of the second semiconductor wafer 20 via the bumps 44 as well, and the non-contact transmission electrodes 42a are disposed on a face of the inspecting chip 42 opposite to the side of the probe card substrate 41. The first semiconductor wafer 10 has the non-contact transmission electrodes 11a disposed on a face of the first semiconductor wafer 10 on the side of the probe card substrate 41. The second semiconductor wafer 20 has the non-contact transmission electrodes 21a disposed on a face of the second semiconductor wafer 20 on the side of the probe card substrate 41. Since communication coils are used as the non-contact transmission electrodes 11a, 21a, and 42a and they perform non-contact transmission through magnetic coupling, a film (for instance a metal layer 41a) that shields magnetic flux is provided in the probe card substrate 41.

Figure 11A:
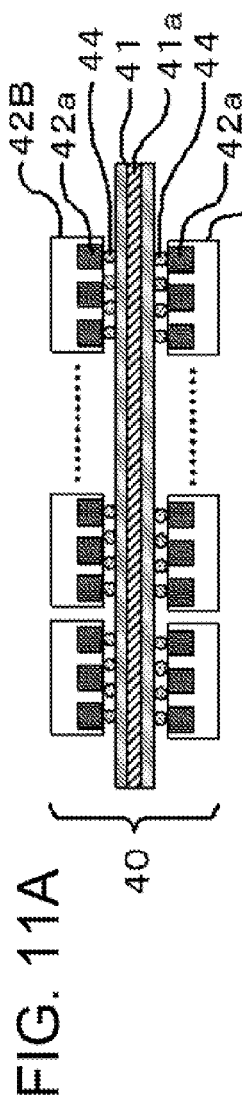
FIGS. 11A, 11B, and 11C are cross-sections schematically showing variations of the double-face type probe card in the semiconductor inspecting device relating to Example 1 of the present invention.
Figure 11B:
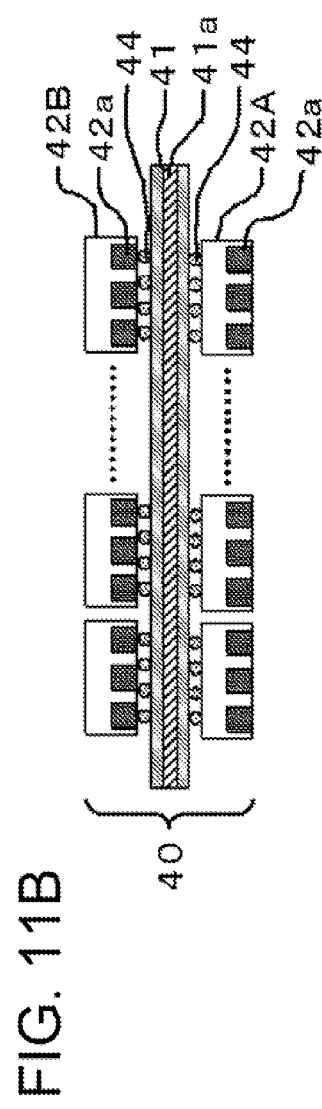
Figure 11C:
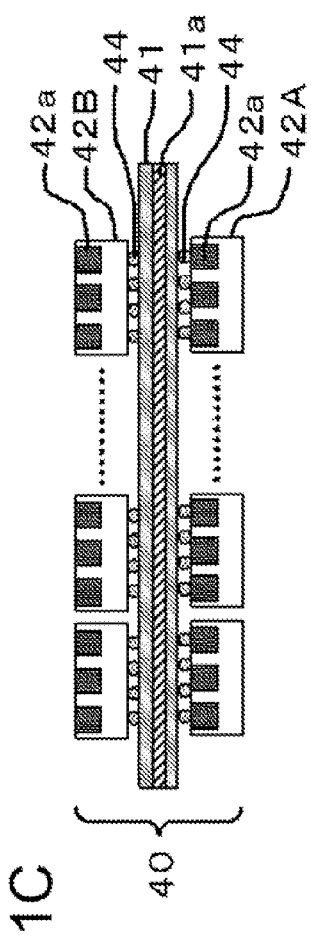

With reference to FIG. 11A as a variation relating to the double-face type probe card 40, the probe card 40 has the inspecting chips 42A and 42B mounted on both faces of the probe card substrate 41 (board) as in FIG. 10, however, the non-contact transmission electrodes 42a of the inspecting chips 42A may be disposed on a face of the inspecting chips 42 on the side of the probe card substrate 41 and the non-contact transmission electrodes 42a of the inspecting chips 42B may be disposed on a face of the inspecting chips 42 on the side of the probe card substrate 41. Further, with reference to FIG. 11B, the probe card 40 may have the inspecting chips 42A and 42B mounted on both faces of the probe card substrate 41 (board), the non-contact transmission electrodes 42a of the inspecting chips 42A may be disposed on a face of the inspecting chips 42 opposite to the side of the probe card substrate 41, and the non-contact transmission electrodes 42a of the inspecting chip 42B may be disposed on a face of the inspecting chip 42 on the side of the probe card substrate 41. Further, with reference to FIG. 11C, the probe card 40 may have the inspecting chips 42A and 42B mounted on both faces of the probe card substrate 41 (board), the non-contact transmission electrodes 42a of the inspecting chip 42A may be disposed on a face of the inspecting chip 42 on the side of the probe card substrate 41, and the non-contact transmission electrodes 42a of the inspecting chips 42B may be disposed on a face of the inspecting chip 42 opposite to the side of the probe card substrate 41.

Figure 12A:
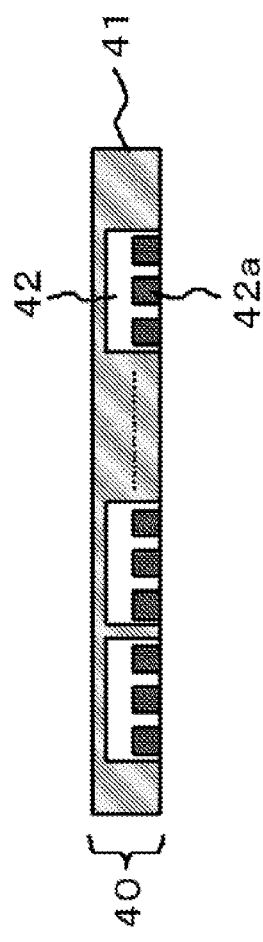
FIGS. 12A and 12B are cross-sections schematically showing variations of an embedded type probe card in the semiconductor inspecting device relating to Example 1 of the present invention.
Figure 12B:
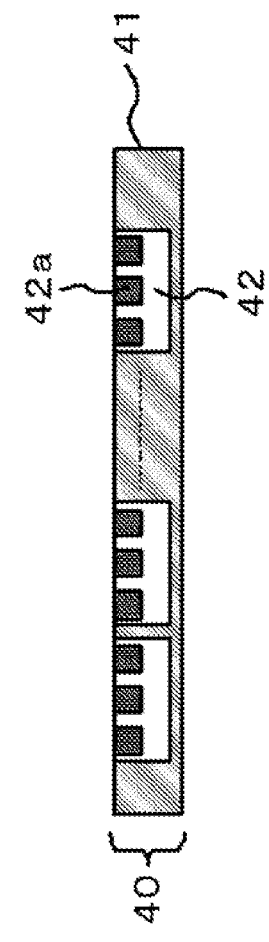

With reference to FIG. 12A as an example (embedded type) in which the probe card 40 has the inspecting chips 42 embedded in the probe card substrate 41, the probe card 40 has the inspecting chips 42 embedded in the probe card substrate 41 (board) and the non-contact transmission electrodes 42a are disposed on the lower face of the inspecting chip 42. Further, with reference to FIG. 12B, the probe card 40 may have the inspecting chips 42 embedded in the probe card substrate 41 (board) and the non-contact transmission electrodes 42a may be disposed on the upper face of the inspecting chips 42.

Figure 13A:
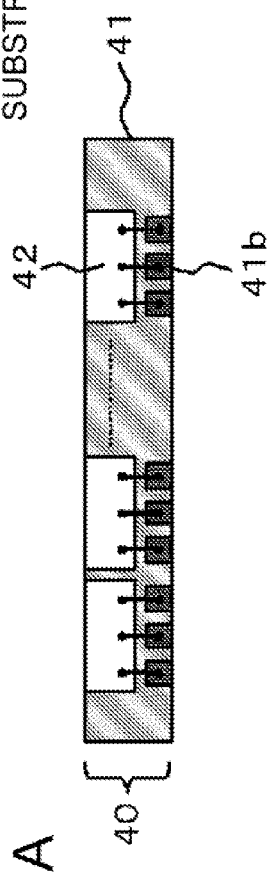
FIGS. 13A, 13A, and 13C are cross-sections schematically showing variations of a substrate-electrode type probe card in the semiconductor inspecting device relating to Example 1 of the present invention.
Figure 13B:
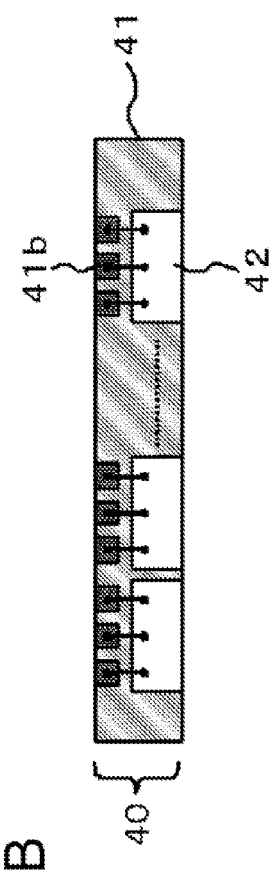
Figure 13C:
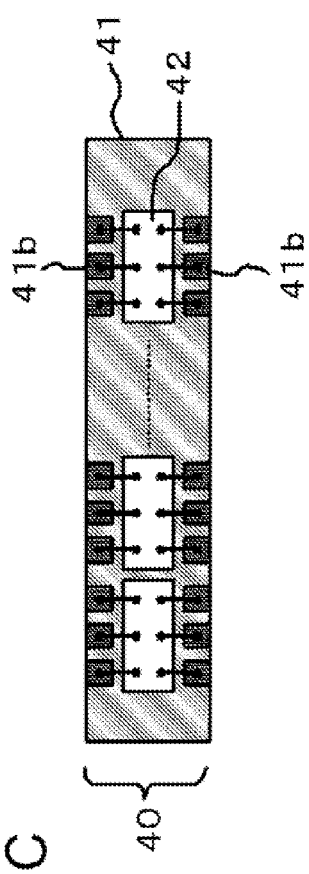

With reference to FIG. 13A as an example (substrate-electrode type) in which the non-contact transmission electrodes are provided on the probe card substrate 41 without providing the non-contact transmission electrodes on the inspecting chip 42, the probe card 40 has the inspecting chips 42 embedded in the probe card substrate 41 (board), non-contact transmission electrodes 41b are disposed on the lower face of the probe card substrate 41, and the non-contact transmission electrodes 41b and the inspecting chips 42 are electrically connected. Further, with reference to FIG. 13B, the probe card 40 has the inspecting chips 42 embedded in the probe card substrate 41 (board), the non-contact transmission electrodes 41b are disposed on the upper face of the probe card substrate 41, and the non-contact transmission electrodes 41b and the inspecting chip(s) 42 are electrically connected. Further, with reference to FIG. 13C, the probe card 40 has the inspecting chips 42 embedded in the probe card substrate 41 (board), the non-contact transmission electrodes 41b are disposed on both faces of the probe card substrate 41, and the non-contact transmission electrodes 41b and the inspecting chip(s) 42 are electrically connected. In FIGS. 13A, 13B, and 13C, the inspecting chips 42 are embedded in the probe card substrate 41, however, the inspecting chips 42 may be flip-chip bonded to the probe card substrate 41.

Figure 14:
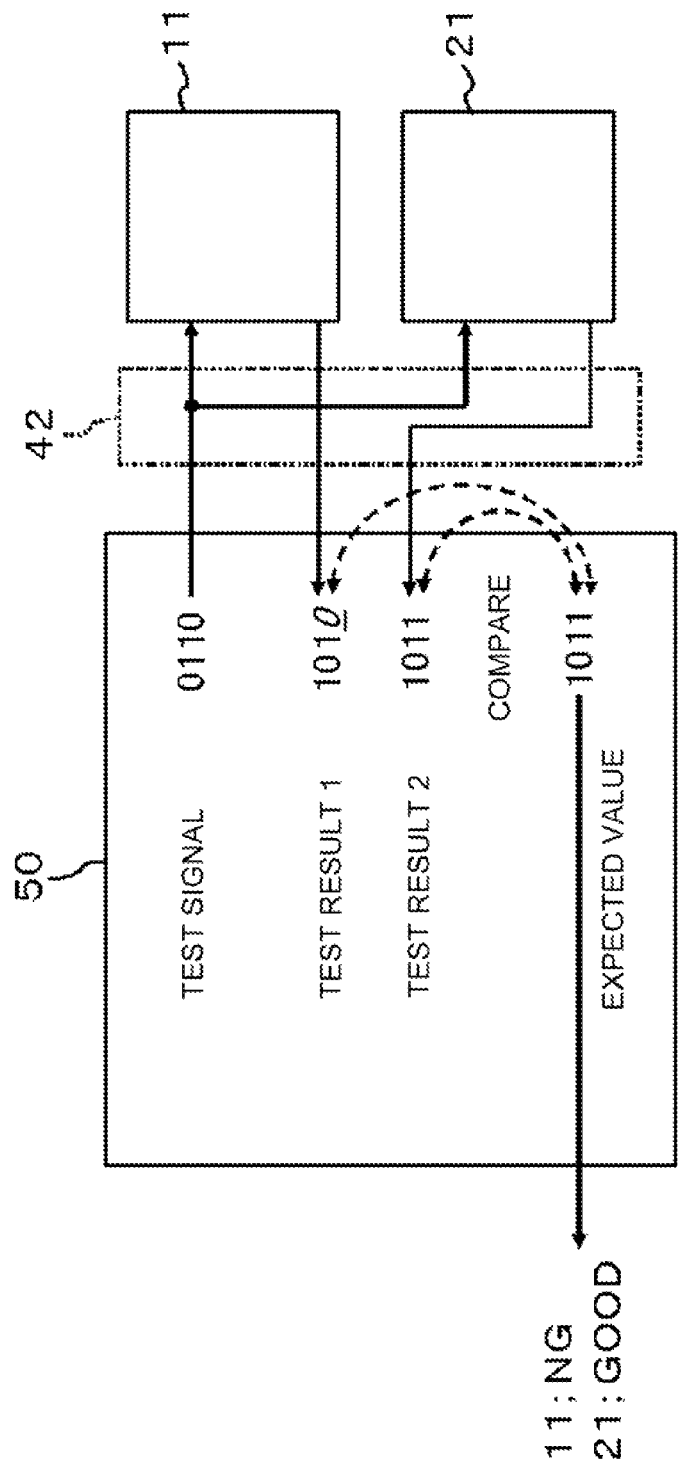
FIG. 14 is a drawing schematically showing an example of the judgment operation of the semiconductor inspecting device relating to Example 1 of the present invention.

Next, the judgment operation of the semiconductor inspecting device relating to Example 1 of the present invention will be described with reference to the drawings. FIG. 14 is a drawing schematically showing an example of the judgment operation of the semiconductor inspecting device relating to Example 1 of the present invention.

First, at the start of a test, a tester 50 transmits a test signal (for instance "0110") simultaneously to a first subject chip 11 and a second subject chip 21 via an inspecting chip 42.

Next, after having received the test signal from the tester 50, the first and the second subject chips 11 and 21 launch the test, and transmit the test results (for instance the test result of the first subject chip 11 "1010," and the test result of the second subject chip 21 "1011") to the tester 50 via the inspecting chip 42.

Next, the tester 50 receives the test results from the first and the second subject chips 11 and 21, and compares the test results to an expected value (for instance an expected value of "1011"). As the result of the comparison, when the test result and the expected value are different, the tester 50 determines that the subject chip corresponding to this test result (the first subject chip 11 in the case of FIG. 14) is "NO GOOD." On the other hand, when the test result matches the expected value, the tester 50 determines that the subject chip corresponding to this test result (the second subject chip 21 in the case of FIG. 14) is "GOOD." Note that it is possible to have the inspection support circuit (42c in FIG. 5) generate the test signal or compare the inspection results to the expected value.

According to Example 1, the number of chips simultaneously inspected can be increased and the inspection time per chip can be reduced without increasing the number of semiconductor inspecting devices by disposing the semiconductor wafers 10 and 20 having the subject chips 11 and 21 formed therein on both faces of the probe card 40. As a result, the inspection cost can be reduced. Further, compared to the conventional semiconductor inspecting devices, the size of the semiconductor inspecting device per wafer can be reduced.

EXAMPLE 2

Figure 15:
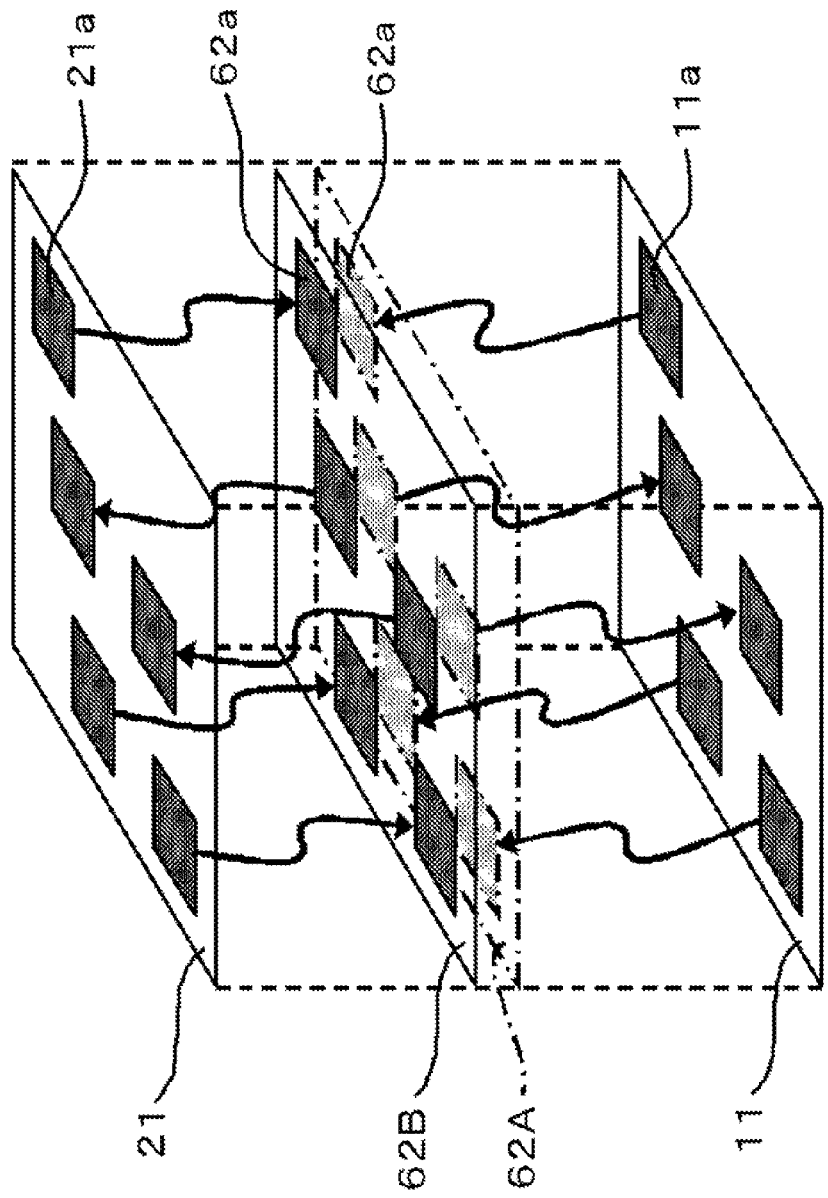
FIG. 15 is a perspective schematically showing the configuration of inspecting chips of a probe card and the subject chips of the semiconductor wafers in a semiconductor inspecting device relating to Example 2 of the present invention.
Figure 16:
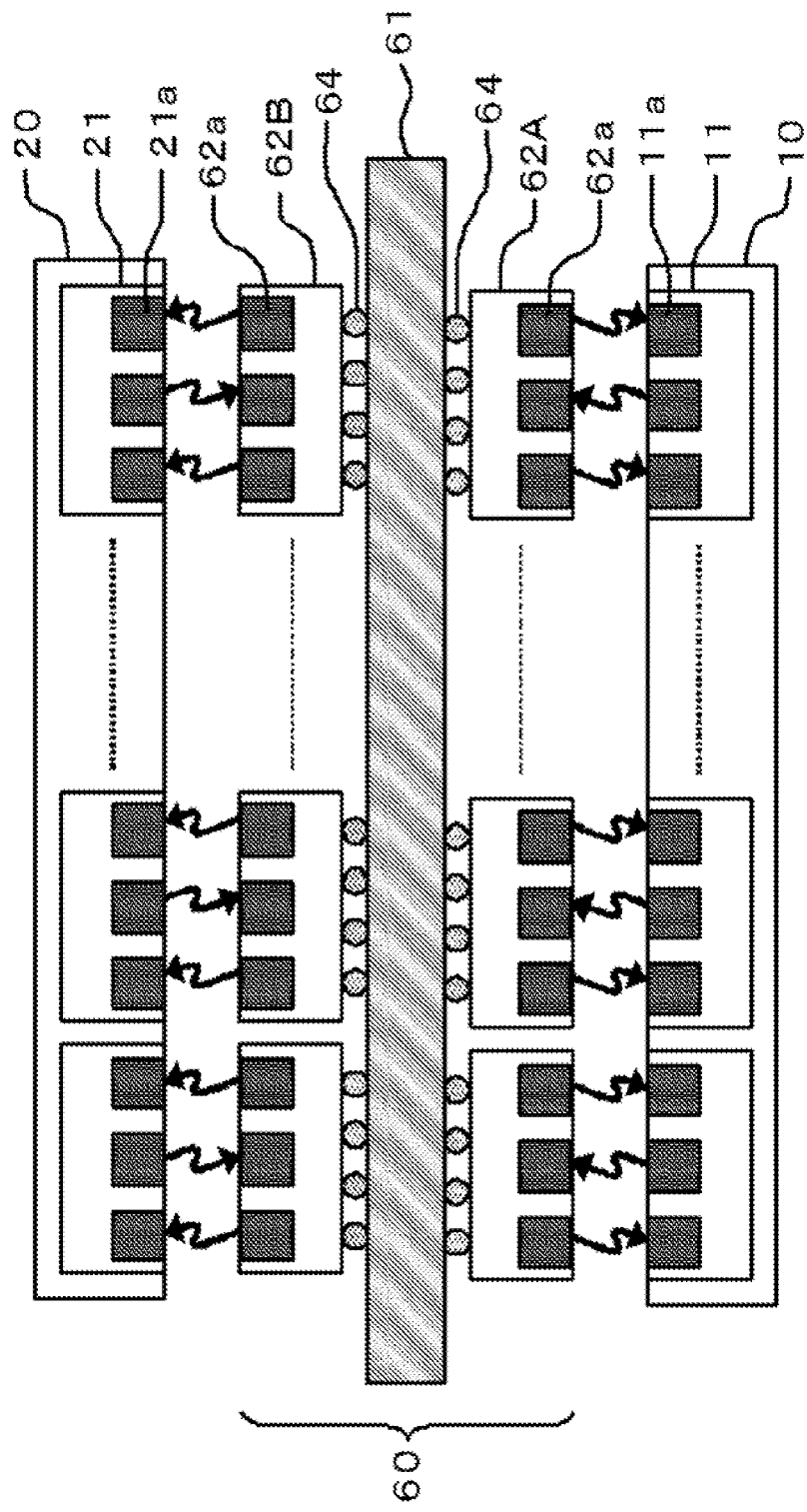
FIG. 16 is a cross-section schematically showing the arrangement of non-contact transmission electrodes of the probe card and the semiconductor wafers in the semiconductor inspecting device relating to Example 2 of the present invention.

A semiconductor inspecting device relating to Example 2 of the present invention will be described with reference to the drawings. FIG. 15 is a perspective view schematically showing the configuration of inspecting chips of a probe card and the subject chips of the semiconductor wafers in the semiconductor inspecting device relating to Example 2 of the present invention. FIG. 16 is a cross-section schematically showing the arrangement of non-contact transmission electrodes of the probe card and the semiconductor wafers in the semiconductor inspecting device relating to Example 2 of the present invention. Note that FIG. 15 corresponds to FIG. 4 of Example 1.

In Example 1, the non-contact transmissions between the inspecting chip (42 in FIG. 4) and the subject chips (11 and 21 in FIG. 4) are performed using magnetic coupling, however, in Example 2, the non-contact transmissions between the inspecting chips 62A and 62B and the subject chips 11 and 21 are performed using capacitive coupling. Example 2 is otherwise configured identically to Example 1.

With reference to FIG. 15, the non-contact transmission electrodes 62a that perform electrically non-contact transmission of power supply and a signal are formed on the inspecting chips 62A and 62B at predetermined locations. On the subject chips 11, the non-contact transmission electrodes 11a that perform electrically non-contact transmission of power supply and a signal are formed at a location(s) corresponding to the location(s) of the non-contact transmission electrode(s) 62a on the inspecting chip 62A. On the subject chip 21, the non-contact transmission electrodes 21a that perform electrically non-contact transmission of power supply and a signal are formed at a location(s) corresponding to the location(s) of the non-contact transmission electrode(s) 62a on the inspecting chip 62B.

With reference to FIG. 16, since the non-contact transmission electrodes must face each other in capacitive coupling, the probe card 60 has the inspecting chips 62A and 62B mounted on both faces of a probe card substrate 61. The probe card 60 has the inspecting chip(s) 62A flip-chip bonded to a face of the probe card substrate 61 on the side of the first semiconductor wafer 10 via bumps 64, and the non-contact transmission electrodes 62a are disposed on a face of the inspecting chip(s) 62 opposite to the side of the probe card substrate 61. Further, the probe card 60 has the inspecting chip(s) 62B flip-chip bonded to a face of the probe card substrate 61 on the side of the second semiconductor wafer 20 via the bumps 64 as well, and the non-contact transmission electrodes 62a are disposed on a face of the inspecting chip(s) 62 opposite to the side of the probe card substrate 61. The first semiconductor wafer 10 has the non-contact transmission electrode(s) 11a disposed on a face of the first semiconductor wafer 10 on the side of the probe card substrate 61. The second semiconductor wafer 20 has the non-contact transmission electrodes 21a disposed on a face of the second semiconductor wafer 20 on the side of the probe card substrate 61. Conductor layers suitable for capacitive coupling are used for the non-contact transmission electrodes 11a, 21a, and 62a.

Figure 17:
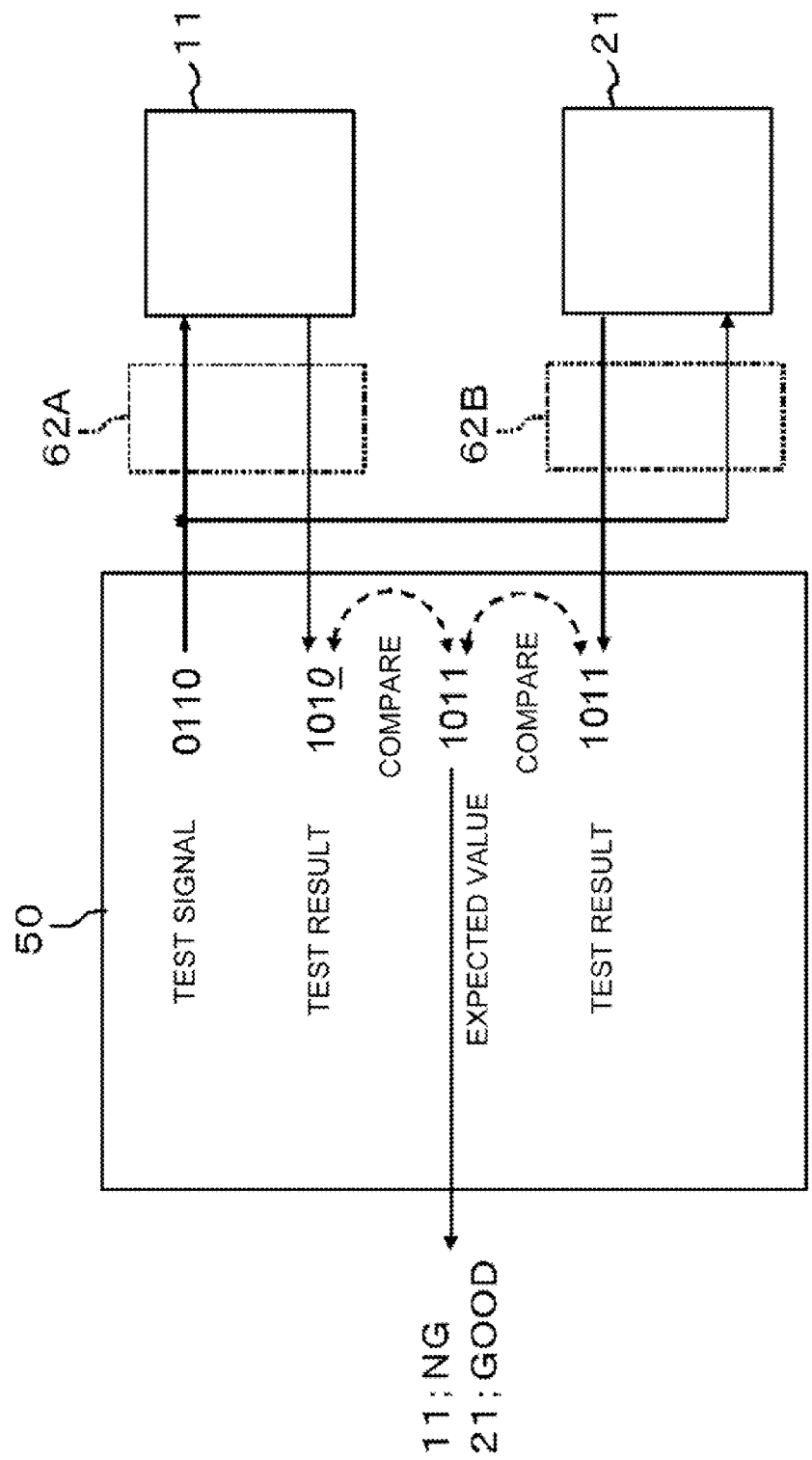
FIG. 17 is a drawing schematically showing an example of the judgment operation of the semiconductor inspecting device relating to Example 2 of the present invention.

Next, the judgment operation of the semiconductor inspecting device relating to Example 2 of the present invention will be described with reference to the drawings. FIG. 17 is a drawing schematically showing an example of the judgment operation of the semiconductor inspecting device relating to Example 2 of the present invention.

First, at the start of a test, the tester 50 transmits a test signal (for instance "0110") to the first subject chip 11 via an inspecting chip 62A and to the second subject chip 21 via an inspecting chip 62B.

Next, after having received the test signal from the tester 50, the first and the second subject chips 11 and 21 launch the test. The first subject chip 11 transmits the test result (for instance the test result of the first subject chip 11 "1010") to the tester 50 via the inspecting chip 62A. The second subject chip 21 transmits the test result (for instance the test result of the second subject chip 21 "1011") to the tester 50 via the inspecting chip 62B.

Next, the tester 50 receives the test results from the first and the second subject chips 11 and 21, and compares the test results to an expected value (for instance an expected value of "1011"). As the result of the comparison, when the test result and the expected value are different, the tester 50 determines that the subject chip corresponding to this test result (the first subject chip 11 in the case of FIG. 17) is "NO GOOD." On the other hand, when the test result matches the expected value, the tester 50 determines that the subject chip corresponding to this test result (the second subject chip 21 in the case of FIG. 17) is "GOOD." Note that it is possible to have an inspection support circuit (corresponding to 42c in FIG. 5) generate the test signal or compare the inspection results to the expected value.

According to Example 2, the same effects as in Example 1 can be obtained.

EXAMPLE 3

Figure 18:
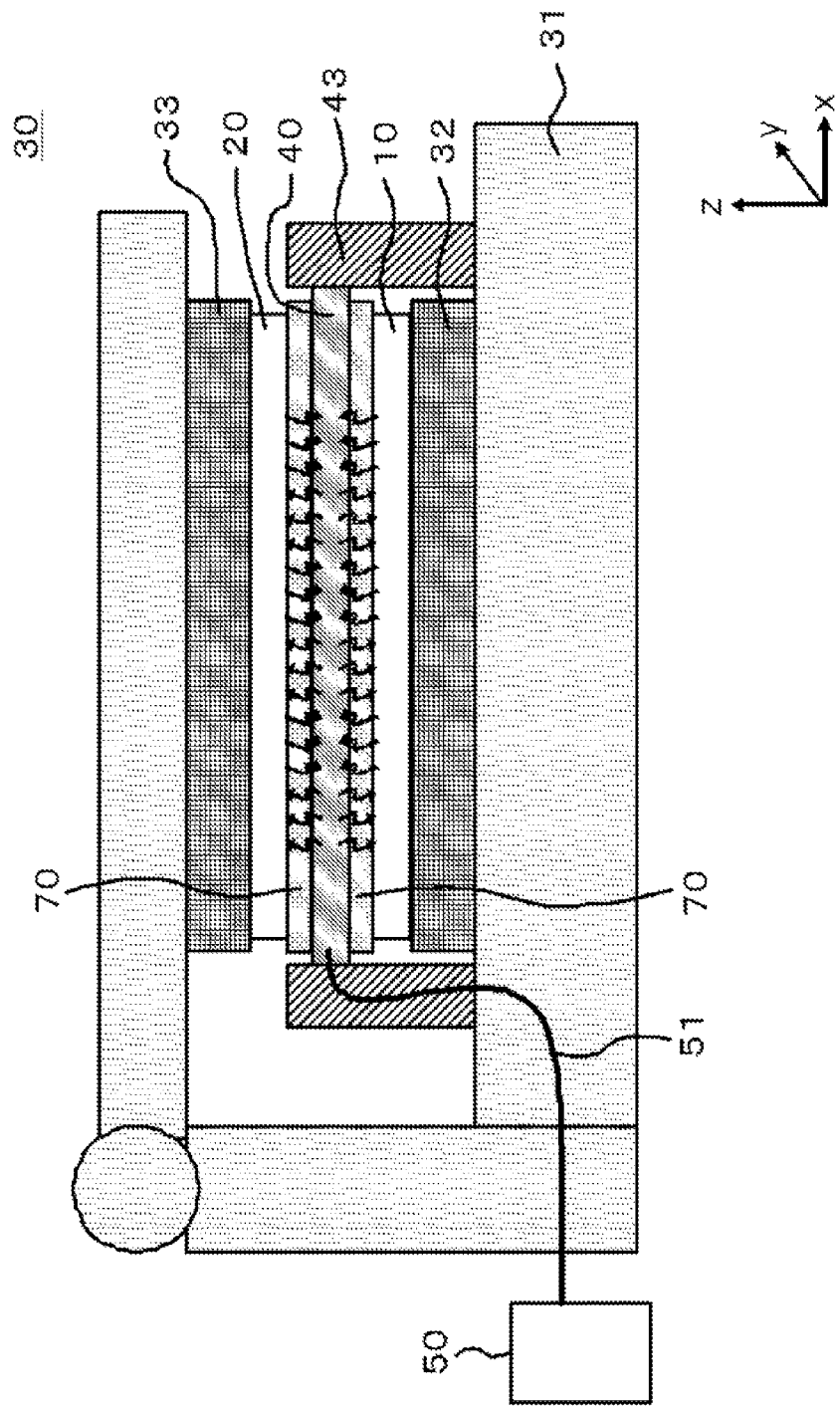
FIG. 18 is a cross-section schematically showing the configuration of a semiconductor inspecting device relating to Example 3 of the present invention.

A semiconductor inspecting device relating to Example 3 of the present invention will be described with reference to the drawings. FIG. 18 is a cross-section schematically showing the configuration of a semiconductor inspecting device relating to Example 3 of the present invention.

In the semiconductor inspecting device relating to Example 3, insulation films 70 having the same film thickness are interposed between the probe card 40 and the semiconductor wafer 10, and between the probe card 40 and the semiconductor wafer 20 of the semiconductor inspecting device relating to Example 1 (refer to FIG. 1). Example 3 is otherwise configured identically to Example 1. Further, the insulation films 70 can be applied to Example 2.

According to Example 3, the same effects as in Example 1 can be obtained, and the bending of the probe card 40 can be avoided.

EXAMPLE 4

Figure 19:
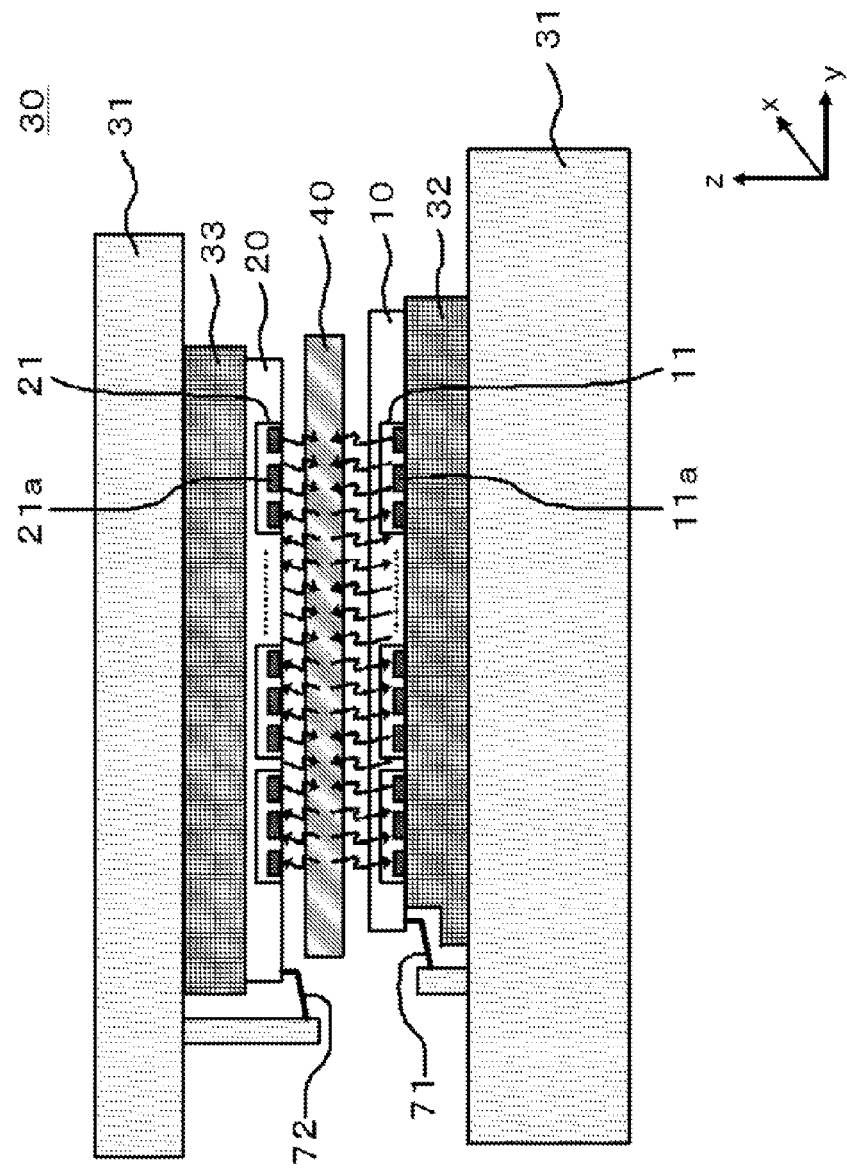
FIG. 19 is a cross-section, along line B-B' in FIG. 20, schematically showing the configuration of a semiconductor inspecting device relating to Example 4 of the present invention.
Figure 20:
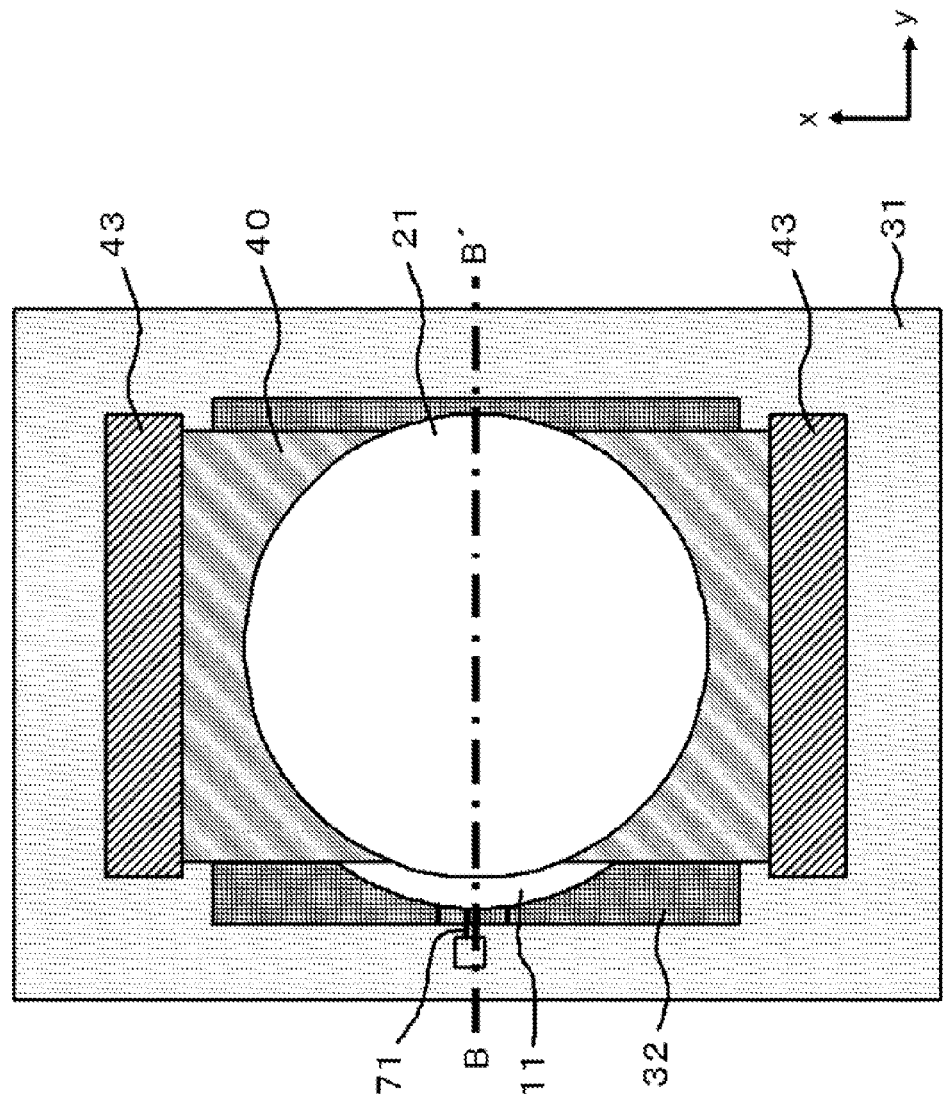
FIG. 20 is a plan schematically showing the configuration of the semiconductor inspecting device relating to Example 4 of the present invention and viewed from the side of the second semiconductor wafer.
Figure 21:
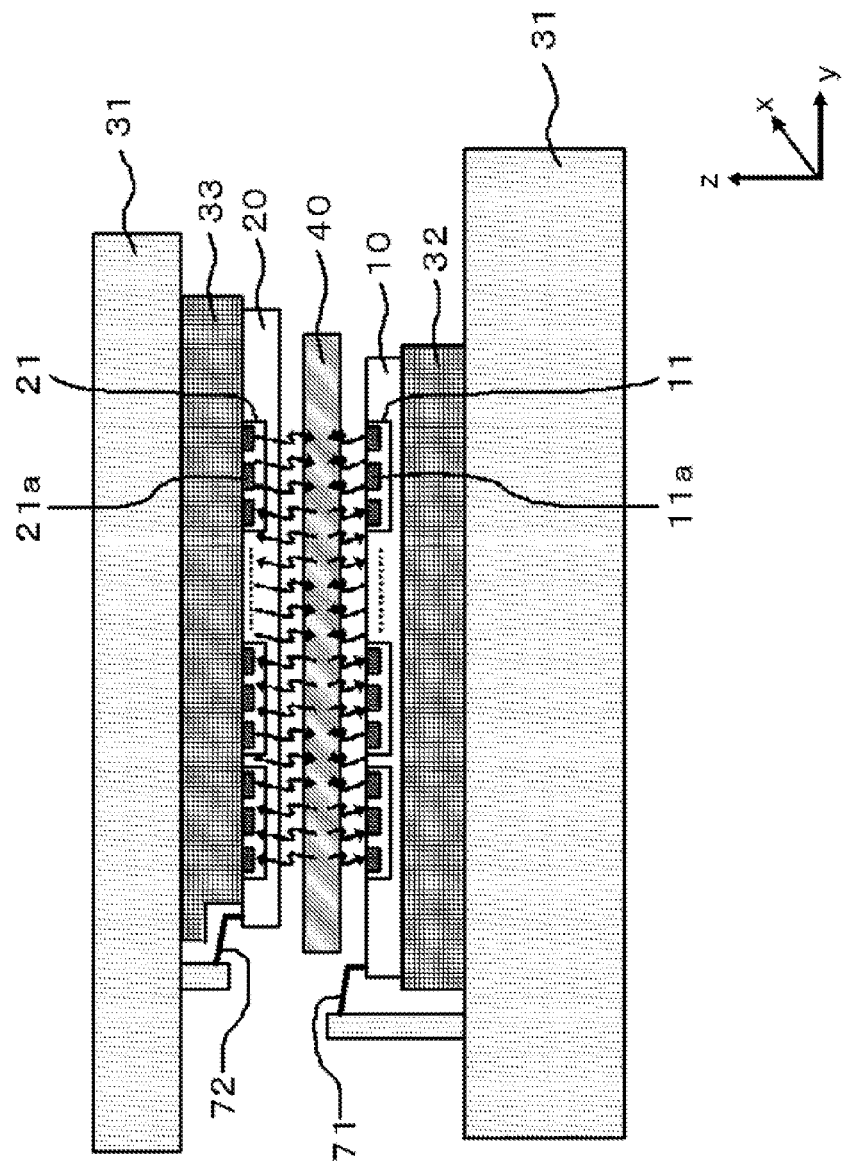
FIG. 21 is a cross-section schematically showing the configuration of a variation of the semiconductor inspecting device relating to Example 4 of the present invention.

A semiconductor inspecting device relating to Example 4 of the present invention will be described with reference to the drawings. FIG. 19 is a cross-section, along line B-B' in FIG. 20, schematically showing the configuration of a semiconductor inspecting device relating to Example 4 of the present invention. FIG. 20 is a plan view schematically showing the configuration of the semiconductor inspecting device relating to Example 4 of the present invention and viewed from the side of the second semiconductor wafer. FIG. 21 is a cross-section schematically showing the configuration of a variation of the semiconductor inspecting device relating to Example 4 of the present invention. Note that the second stage 33, the head of the prober 31, and a second probe needle 72 in FIG. 19 are not shown in FIG. 20.

In Example 1, the transmissions between the inspecting chip (42 in FIG. 4) and the subject chips (11 and 21 in FIG. 4) are all non-contact, however, in Example 4, power supply and common signals such as a clock signal are transmitted to each of the subject chips 11 and 21 by having probe needles 71 and 72 contact the semiconductor wafers 10 and 20, and other signals are transmitted in a non-contact manner. Example 4 is otherwise configured identically to Example 1. Note that the contact between the probe needles 71 and 72 and the semiconductor wafers 10 and 20 can be applied to Examples 2 and 3.

With reference to FIGS. 19 and 20, the first semiconductor wafer 10 has non-contact transmission electrodes 11a disposed on a face of the first semiconductor wafer 10 opposite to the side of the probe card substrate 41, and comprises an electrode pad (not shown in the drawing) that contacts the first probe needle 71 on a face of the first semiconductor wafer 10 opposite to the side of the probe card substrate 41. The electrode pad that contacts the first probe needle 71 is disposed in a region where the subject chip 11 is not disposed, and is electrically connected to each subject chip 11 via a wiring (not shown in the drawing). The second semiconductor wafer 20 has non-contact transmission electrodes 21a disposed on a face of the second semiconductor wafer 20 on the side of the probe card substrate 41, and comprises an electrode pad (not shown in the drawing) that contacts the second probe needle 72 on a face of the second semiconductor wafer 20 on the side of the probe card substrate 41. The electrode pad that contacts the second probe needle 72 is disposed in a region where the subject chip 21 is not disposed, and is electrically connected to each subject chip 21 via a wiring (not shown in the drawing). The second semiconductor wafer 20 is disposed in such a manner that there is a region where the first and the second semiconductor wafers 10 and 20 do not overlap.

The first probe needle 71 is a probe needle that provides power supply and common signals such as a clock signal to the first semiconductor wafer 10 and contacts the electrode pad (not shown in the drawing) disposed on the face of the first semiconductor wafer 10 opposite to the side of the probe card substrate 41. The first probe needle 71 is fixed onto the base of the prober 31 and is electrically connected to a tester (corresponding to 50 in FIG. 1) via a wiring (not shown in the drawing). The second probe needle 72 is a probe needle that provides power supply and common signals such as a clock signal to the second semiconductor wafer 20 and contacts the electrode pad (not shown in the drawing) disposed on the face of the second semiconductor wafer 20 on the side of the probe card substrate 41. The second probe needle 72 is fixed onto the head of the prober 31 and is electrically connected to the tester (corresponding to 50 in FIG. 1) via a wiring (not shown in the drawing).

With reference to FIG. 21 as a variation of FIG. 19, the first semiconductor wafer 10 has non-contact transmission electrodes 11a disposed on a face of the first semiconductor wafer 10 on the side of the probe card substrate 41, and comprises an electrode pad (not shown in the drawing) that contacts the first probe needle 71 on a face of the first semiconductor wafer 10 on the side of the probe card substrate 41. The electrode pad that contacts the first probe needle 71 is disposed in a region where the subject chip 11 is not disposed, and is electrically connected to each subject chip 11 via a wiring (not shown in the drawing). The second semiconductor wafer 20 has non-contact transmission electrodes 21a disposed on a face of the second semiconductor wafer 20 opposite to the side of the probe card substrate 41, and comprises an electrode pad (not shown in the drawing) that contacts the second probe needle 72 on a face of the second semiconductor wafer 20 opposite to the side of the probe card substrate 41. The electrode pad that contacts the second probe needle 72 is disposed in a region where the subject chip 21 is not disposed, and is electrically connected to each subject chip 21 via a wiring (not shown in the drawing). The second semiconductor wafer 20 is disposed in such a manner that there is a region where the first and the second semiconductor wafers 10 and 20 do not overlap.

The first probe needle 71 is a probe needle that provides power supply and common signals such as a clock signal to the first semiconductor wafer 10 and contacts the electrode pad (not shown in the drawing) disposed on the face of the first semiconductor wafer 10 on the side of the probe card substrate 41. The first probe needle 71 is fixed onto the base of the prober 31 and is electrically connected to a tester (corresponding to 50 in FIG. 1) via a wiring (not shown in the drawing). The second probe needle 72 is a probe needle that provides power supply and common signals such as a clock signal to the second semiconductor wafer 20 and contacts the electrode pad (not shown in the drawing) disposed on the face of the second semiconductor wafer 20 opposite to the side of the probe card substrate 41. The second probe needle 72 is fixed onto the head of the prober 31 and is electrically connected to the tester (corresponding to 50 in FIG. 1) via a wiring (not shown in the drawing).

According to Example 4, the same effects as in Example 1 can be obtained, power supply and common signals such as a clock signal can be supplied via the probe needles 71 and 72, and the number of the non-contact transmission electrodes 11a and 21a in the subject chips 11 and 21 can be reduced.

EXAMPLE 5

A semiconductor inspecting device relating to Example 5 of the present invention will be described with reference to the drawings. FIG. 22 is a cross-section schematically showing the configuration of a semiconductor inspecting device relating to Example 5 of the present invention.

In Example 1, the transmissions between the probe card (40 in FIG. 1) and the semiconductor wafers (10 and 20 in FIG. 1) are all non-contact, however, in Example 5, the transmissions between the probe card 40 and the semiconductor wafers 10 and 20 are performed only by contact transmission using probe pins 73. The probe pins 73 are disposed on both faces of the probe card 40, contact pads (corresponding to the pad 11c in FIG. 5) of the semiconductor wafers 10 and 20, and are electrically connected to the tester 50 via the wiring 51.

According to Example 5, the same effects as in Example 1 can be obtained, and the non-contact transmission electrodes do not need to be provided in the semiconductor wafers 10 and 20.

EXAMPLE 6

A semiconductor inspecting device relating to Example 6 of the present invention will be described with reference to the drawings. FIG. 23 is a drawing schematically showing the configuration of a semiconductor inspecting device relating to Example 6 of the present invention.

In Example 1, the probe card (40 in FIG. 1) and the semiconductor wafers (10 and 20 in FIG. 1) are mounted horizontally, however, in Example 6, the probe card 40 and the semiconductor wafers 10 and 20 are mounted vertically. Example 6 is otherwise configured identically to Example 1. Note that the probe card 40 and the semiconductor wafers 10 and 20 can be mounted vertically in Examples 2 to 5 as well.

According to Example 6, the same effects as in Example 1 can be obtained, and the inspection can be performed without having the probe card 40 bent.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

EXPLANATIONS OF SYMBOLS

10: first semiconductor wafer
11: first subject chip
11a: non-contact transmission electrode
11b: non-contact transmission electrode interface circuit
11c: pad
11d: subject circuit
20: second semiconductor wafer
21: second subject chip
21a: non-contact transmission electrode
30: semiconductor inspecting device
31: prober
32: first stage
33: second stage
40, 60: probe card
41, 61: probe card substrate
41a: metal layer
41b: non-contact transmission electrode
42, 42A, 4213, 62A, 62B: inspecting chip
42a, 62a: non-contact transmission electrode
42b: non-contact transmission interface circuit
42c: inspection support circuit
43, 63: probe card support base
44, 64: bumps 50: tester
51: wiring
70: insulation film
71: first probe needle
72: second probe needle
73: probe pin

The invention claimed is:

1. A semiconductor inspecting device comprising:
   a probe card that transmits a signal or power supply to semiconductor wafers having one or more inspecting chips formed therein; wherein
   a first semiconductor wafer faces a first face of said probe card and a second semiconductor wafer faces a second face opposite to said first face of said probe card, wherein
   said probe card comprises one or more inspecting chips capable of performing non-contact transmission to a first subject chip in said first semiconductor wafer and a second subject chip in said second semiconductor wafer,
   said first subject chip and said second subject chip include at least one non-contact transmission electrode that performs non-contact transmission of a signal or power supply, and
   said inspecting chip includes at least one non-contact transmission electrode that performs non-contact transmission of a signal or power supply to said non-contact transmission electrode of said first subject chip or said second subject chip or to said non-contact transmission electrodes of said both chips.

2. The semiconductor inspecting device as defined in claim 1, wherein said probe card has said inspecting chip mounted on one face of a substrate.

3. The semiconductor inspecting device as defined in claim 2, wherein said non-contact transmission electrode of said inspecting chip is disposed on a face of said inspecting chip on the side of said substrate or on the opposite face thereof.

4. The semiconductor inspecting device as defined in claim 3, wherein said probe card has said inspecting chips mounted on both faces of a substrate.

5. The semiconductor inspecting device as defined in claim 4, wherein
   a non-contact transmission electrode of a first inspecting chip mounted on a first face of said substrate is disposed on a face of said first inspecting chip on the side of said substrate side or on the opposite face thereof; and
   a non-contact transmission electrode of a second inspecting chip mounted on a second face on the opposite side to said first face of said substrate is disposed on a face of said second inspecting chip on the side of said substrate or on the opposite face thereof.

6. The semiconductor inspecting device as defined in claim 4, wherein said substrate has a metal layer that magnetically shields between said first inspecting chip and said second inspecting chip built therein.

7. The semiconductor inspecting device as defined in claim 1, wherein said probe card has said inspecting chip embedded in a substrate.

8. The semiconductor inspecting device as defined in claim 7, wherein
   said probe card comprises a substrate that includes at least one non-contact transmission electrode that performs non-contact transmission of a signal or power supply to said non-contact transmission electrode of said first subject chip or said second subject chip or to said non-contact transmission electrodes of said both chips; and
   said non-contact transmission electrode(s) of said substrate is(are) electrically connected to said inspecting chip.

9. The semiconductor inspecting device as defined in claim 8, wherein said non-contact transmission electrode(s) of said substrate is(are) disposed on a face of said substrate on the side of said first subject chip or a face on the side of said second subject chip or on the both faces.

10. The semiconductor inspecting device as defined in claim 1, wherein
    said non-contact transmission electrode(s) of said first semiconductor wafer is(are) disposed on a face of said first semiconductor wafer on the side of said probe card or on the opposite face thereof; and
    said non-contact transmission electrode(s) of said second semiconductor wafer is(are) disposed on a face of said second semiconductor wafer on the side of said probe card or on the opposite face thereof.

11. The semiconductor inspecting device as defined in claim 1, wherein said non-contact transmission electrode(s) is(are) a communication coil.

12. The semiconductor inspecting device as defined in claim 1, wherein said non-contact transmission electrode(s) is(are) a conductor layer for capacitive coupling.

13. The semiconductor inspecting device as defined in claim 1, wherein an insulator is interposed between said probe card and either said first semiconductor wafer or said second semiconductor wafer or both.

14. The semiconductor inspecting device as defined in claim 1, wherein
    said first semiconductor wafer or said second semiconductor wafer or both comprise an electrode(s) disposed in a region where said subject chip is not disposed and electrically connected to each of said subject chips; and
    a probe needle(s) that contacts said electrode(s) and supplies power or a signal to said electrode(s) is(are) provided.

15. The semiconductor inspecting device as defined in claim 1, wherein said probe card has a plurality of probe pins disposed on one face or both faces, and said probe pins are arranged in such a manner that they contact said first semiconductor wafer or said second semiconductor wafer or both.

16. The semiconductor inspecting device as defined in claim 1, wherein said first semiconductor wafer and said second semiconductor wafer are of the same type or different types.

17. The semiconductor inspecting device as defined in claim 1 comprising:
    a card support base that detachably supports said probe card;
    a first wafer stage that supports said first semiconductor wafer; and
    a second wafer stage that supports said second semiconductor wafer;
    wherein
    at least two of said card support base, said first wafer stage, and said second wafer stage have a positioning mechanism.

18. The semiconductor inspecting device as defined in claim 1, wherein said probe card, said first semiconductor wafer, and said second semiconductor wafer are disposed perpendicular to a horizontal plane.

19. A semiconductor inspecting method including:
    causing a probe card disposed between a first semiconductor wafer and a second semiconductor wafer simultaneously to perform a non-contact transmission of an inspection signal to both a first subject chip formed in said first semiconductor wafer and a second subject chip formed in said second semiconductor wafer (termed as "first step"); and causing said first subject chip and said second subject chip that have received said inspection signal to perform a non-contact transmission of the respective inspection results to said probe card simultaneously or sequentially (termed as "second step"), wherein said probe card comprises one or more inspecting chips capable of performing non-contact transmission to said first subject ship in said first semiconductor wafer and said second subject chip in said second semiconductor wafer, said first subject chip and said second subject chip include at least one non-contact transmission electrode that performs non-contact transmission of a signal or power supply, and said inspecting chip includes at least one non-contact transmission electrode that performs non-contact transmission of a signal or power supply to said non-contact transmission electrode of said first subject chip or said second subject chip or to said non-contact transmission electrodes of said both chips.

20. A semiconductor inspecting method including:

causing a first inspecting chip disposed on a side of a probe card, disposed between a first semiconductor wafer and a second semiconductor wafer, closer to said first semiconductor wafer and a second inspecting chip disposed on a side of said probe card closer to said second semiconductor wafer simultaneously or independently to perform a non-contact transmission of an inspection signal to a first subject chip formed in said first semiconductor wafer and to a second subject chip formed in said second semiconductor wafer respectively; and causing said first subject chip and said second subject chip that have received said inspection signal simultaneously or independently to perform a non-contact transmission of the inspection results to said first inspecting chip and to said second inspecting chip respectively, wherein said probe card comprises one or more inspecting chips capable of performing non-contact transmission to said first subject chip in said first semiconductor wafer and said second subject chip in said second semiconductor wafer, said first subject chip and said second subject chip include at least one non-contact transmission electrode that performs non-contact transmission of a signal or power supply, and said inspecting chip includes at least one non-contact transmission electrode that performs non-contact transmission of a signal or power supply to said non-contact transmission electrode of said first subject chip or said second subject chip or to said non-contact transmission electrodes of said both chips.

21. A semiconductor device manufacturing method including:

causing a probe card disposed between a first semiconductor wafer and a second semiconductor wafer simultaneously to perform a non-contact transmission of an ins section signal to both a first subject chip formed in said first semiconductor wafer and a second subject chip formed in said second semiconductor wafer (termed as "first step");

and causing said first subject chip and said second subject chip that have received said inspection signal to perform a non-contact transmission of the respective inspection results to said probe card simultaneously or sequentially (termed as "second step"), wherein said probe card comprises one or more inspecting chips capable of performing non-contact transmission to said first subject chip in said first semiconductor wafer and said second subject chip in said second semiconductor wafer, said first subject chip and said second subject chip include at least one non-contact transmission electrode that performs non-contact transmission of a signal or power supply, and said inspecting chip includes at least one non-contact transmission electrode that performs non-contact transmission of a signal or power supply to said non-contact transmission electrode of said first subject chip or said second subject chip or to said non-contact transmission electrodes of said both chips.

* * * * *